United States Patent [19]
Thorn et al.

[11] Patent Number: 5,476,580
[45] Date of Patent: Dec. 19, 1995

[54] PROCESSES FOR PREPARING A NON-CONDUCTIVE SUBSTRATE FOR ELECTROPLATING

[75] Inventors: Charles E. Thorn, Newport, Ky.; Frank Polakovic, Ringwood, N.J.; Charles A. Mosolf, Juno Beach, Fla.

[73] Assignee: Electrochemicals Inc., Maple Plain, Minn.

[21] Appl. No.: 232,574

[22] Filed: May 3, 1994

Related U.S. Application Data

[63] Continuation-in-part of Ser. No. 62,943, May 17, 1993, Pat. No. 5,389,270.

[51] Int. Cl.$^6$ ..................................................... C25D 5/02
[52] U.S. Cl. ........................... 205/122; 205/125; 205/162; 205/164; 205/166; 205/183
[58] Field of Search .................................... 205/122, 125, 205/162, 164, 166, 183

[56] References Cited

U.S. PATENT DOCUMENTS

| | | | |
|---|---|---|---|
| 409,096 | 8/1889 | Blank | 205/159 |
| 1,037,469 | 9/1912 | Goldberg | 427/123 |
| 2,176,879 | 10/1939 | Bartell | 44/9 |
| 2,243,429 | 5/1941 | Laux | 204/30 |
| 2,692,857 | 10/1954 | Michel et al. | 252/28 |
| 2,833,736 | 5/1958 | Glaser | 260/29.6 |
| 2,897,409 | 7/1959 | Gitto | 317/101 |

(List continued on next page.)

FOREIGN PATENT DOCUMENTS

| | | |
|---|---|---|
| 72-8325 | 4/1972 | Czechoslovakia . |
| 78-7560 | 7/1978 | Czechoslovakia . |
| 182408 | 3/1980 | Czechoslovakia . |
| 0085413 | 8/1983 | European Pat. Off. . |
| 0381761 | 8/1990 | European Pat. Off. . |
| 49-36429 | 4/1974 | Japan . |
| 51-22084 | 8/1976 | Japan . |
| 52-87694 | 7/1977 | Japan . |
| 57-210512 | 5/1982 | Japan . |
| 58-138795 | 8/1983 | Japan . |
| 59-223769 | 12/1984 | Japan . |
| 60-110893 | 6/1985 | Japan . |
| 60-155280 | 8/1985 | Japan . |
| 61-51097 | 3/1986 | Japan . |
| 61-127612 | 6/1986 | Japan . |
| 63-125580 | 5/1988 | Japan . |
| 1-219170 | 9/1989 | Japan . |
| 2-151682 | 6/1990 | Japan . |
| 2-258897 | 10/1990 | Japan . |
| 3-207890 | 9/1991 | Japan . |
| 4-332774 | 11/1992 | Japan . |
| 571435 | 9/1977 | U.S.S.R. . |
| 674981 | 10/1979 | U.S.S.R. . |
| 768793 | 2/1980 | U.S.S.R. . |
| 745964 | 11/1980 | U.S.S.R. . |
| 943333 | 3/1982 | U.S.S.R. . |
| 1176597 | 1/1970 | United Kingdom . |
| 1506464 | 4/1978 | United Kingdom . |
| 2177707 | 1/1987 | United Kingdom . |

OTHER PUBLICATIONS

Adsorption of Oxy–Ethylated Nonionic Surfactants and its Influence on the Stability of the Aqueous Dispersions of Graphite, 7 Colloid Journal, No. 6, pp. 1148–1153, Moraru et al., 1984 (no month) (abstract only translated).

Studies of Graphitized Black After Contact with Aqueous Solution of Surfactant by the Method of Slow Neutron Scattering, Chemistry and Technology of Water, 1991 T. 13, No. 8 pp. 678–681, 1991 (no month) (abstract only translated).

Heats of Adsorption of Gold Chloride and Cyanide Complexes from Aqueous Solutions on Graphitized Carbon Black and a Coconut Active Carbon, Pergamon Press plc, Carbon vol. 29, No. 7 pp. 821–829, Groszek et al. (1991) no month.

Preparation of Suspensions for Particle Size Analysis, Methodical Recommendations, Liquids and Dispersing Agents, Advances in Colloid and Interface Science, 29 (1988) 79–139, Bernhardt, no month.

Aqualon, CMC Aqualon Sodium Carboxymethycellulose, Physical and Chemical Properties (no date).

Aqualon, Klucel Hydroxypropycellulose, Physical and Chemical Properties, Aqualon (no date).

Aqualon, Natrosol Hydroxyethylcellulose, A Nonionic Water–Soluble Polymer, Physical and Chemical Properties, Aqualon (no date).

Hercules, Hercules, Nitrocellulose, The First Thermoplastic Polymer Made From A Renewable Resource, Chemical and Physical Properties (no date).

Hercules, Chemical and Physical Properties of Hercules Ethylcellulose, A Specialty Polymer With Broad Stability And Compatibility (no date).

Dow Chemical Company, Methocel Cellulose Ethers, Binders and processing aids for ceramics (no date).

Kelco, Technical Bulletin DB—1 5, 1991 (no month).

Rohm and Haas, Rohm and Haas Products For The Graphic Arts Industry, Acrysol I–545 (no date).

(List continued on next page.)

Primary Examiner—John Niebling
Assistant Examiner—Edna Wong
Attorney, Agent, or Firm—McAndrews, Held & Malloy, Ltd.

[57] ABSTRACT

A composition and process for preparing a non-conductive substrate for electroplating. The composition comprises 0.1 to 20% by weight carbon (e.g. graphite or carbon black) having a mean particle size within the range of 0.05 to 50 microns; optionally, 0.01 to 10% by weight of a water soluble or dispersible binding agent for binding to the carbon particles; optionally, an effective amount of an anionic dispersing agent for dispersing the bound carbon particles; optionally, an amount of a surfactant that is effective for wetting the through hole; a pH within the range of 4–14; and an aqueous dispersing medium. Improved methods of applying the composition to a through hole, a printed wiring board having a through hole treated with the composition, and a method of fixing a carbon coating deposited on a through hole using an acid solution are also disclosed.

19 Claims, No Drawings

U.S. PATENT DOCUMENTS

| | | | |
|---|---|---|---|
| 2,978,428 | 4/1961 | Aberegg | 260/29.6 |
| 2,983,220 | 5/1961 | Dalton et al. | 101/149.2 |
| 3,099,608 | 7/1963 | Radovsky et al. | 204/15 |
| 3,152,996 | 10/1964 | Forrester | 252/313 |
| 3,163,588 | 12/1964 | Shortt et al. | 204/16 |
| 3,249,559 | 5/1966 | Gallas | 252/510 |
| 3,495,962 | 2/1970 | Norton | 65/26 |
| 3,506,482 | 4/1970 | Hirohata et al. | 117/212 |
| 3,509,088 | 4/1970 | Dalton | 260/41 |
| 3,515,201 | 6/1970 | Zimmerman | 164/66 |
| 3,518,116 | 6/1970 | Stock et al. | 117/226 |
| 3,565,658 | 2/1971 | Frazier et al. | 106/307 |
| 3,578,577 | 5/1971 | Gilchrist | 204/181 |
| 3,639,121 | 2/1972 | York | 96/1.5 |
| 3,655,530 | 4/1972 | Taylor | 204/26 |
| 3,696,054 | 10/1972 | Saunders | 252/511 |
| 3,697,450 | 10/1972 | Takenaka et al. | 252/511 |
| 3,725,214 | 4/1973 | Bride | 204/12 |
| 3,764,280 | 10/1973 | Lupinski | 29/195 |
| 3,818,412 | 6/1974 | Deardurff | 338/214 |
| 3,852,131 | 12/1974 | Houston | 156/3 |
| 3,865,626 | 2/1975 | Diener et al. | 117/226 |
| 3,865,699 | 2/1975 | Luch | 204/20 |
| 3,870,987 | 3/1975 | Wiley et al. | 338/214 |
| 3,874,862 | 4/1975 | Bickling, Jr. et al. | 65/26 |
| 3,881,048 | 4/1975 | Bertrand | 428/447 |
| 3,966,581 | 6/1976 | Holte | 204/202 |
| 3,983,042 | 9/1976 | Jain et al. | 252/18 |
| 3,991,397 | 11/1976 | King | 338/214 |
| 4,035,265 | 7/1977 | Saunders | 252/510 |
| 4,090,984 | 5/1978 | Lin et al. | 252/511 |
| 4,104,178 | 8/1978 | Jain et al. | 252/30 |
| 4,187,334 | 2/1980 | LaBate | 427/236 |
| 4,205,974 | 6/1980 | Franz | 65/40 |
| 4,213,870 | 7/1980 | Loran | 252/51.5 R |
| 4,239,794 | 12/1980 | Allard | 428/219 |
| 4,239,818 | 12/1980 | LaBate | 427/236 |
| 4,254,180 | 3/1981 | Kline | 428/323 |
| 4,278,511 | 7/1981 | Dugan | 204/15 |
| 4,316,831 | 2/1982 | LaBate | 260/29.6 S |
| 4,321,295 | 3/1982 | Smith-Johannsen | 428/206 |
| 4,368,252 | 1/1983 | Kakuhashi et al. | 430/312 |
| 4,389,278 | 6/1983 | Kai | 156/630 |
| 4,401,579 | 8/1983 | Kratzer | 252/17 |
| 4,416,790 | 11/1983 | Schürmann et al. | 252/62 |
| 4,424,930 | 1/1984 | Wilhelmson | 228/20 |
| 4,430,166 | 2/1984 | Carter | 204/15 |
| 4,465,565 | 8/1984 | Zanio | 204/56 R |
| 4,547,311 | 10/1985 | Sako et al. | 252/511 |
| 4,571,286 | 2/1986 | Penato | 204/15 |
| 4,581,301 | 4/1986 | Michaelson | 428/551 |
| 4,617,579 | 10/1986 | Sachdev et al. | 346/135.1 |
| 4,619,741 | 10/1986 | Minten et al. | 204/15 |
| 4,622,107 | 11/1986 | Piano | 204/15 |
| 4,622,108 | 11/1986 | Polakovic et al. | 204/15 |
| 4,629,537 | 12/1986 | Hsu | 204/15 |
| 4,631,117 | 12/1986 | Minten et al. | 204/15 |
| 4,683,036 | 7/1987 | Morrissey et al. | 204/15 |
| 4,684,560 | 8/1987 | Minten et al. | 428/131 |
| 4,691,091 | 9/1987 | Lyons et al. | 219/121 LM |
| 4,718,993 | 1/1988 | Cupta et al. | 205/125 |
| 4,724,005 | 2/1988 | Minten et al. | 106/307 |
| 4,735,676 | 4/1988 | Iwasa | 156/630 |
| 4,735,734 | 4/1988 | Staub et al. | 252/29 |
| 4,758,358 | 7/1988 | Lum et al. | 252/22 |
| 4,790,902 | 12/1988 | Wada et al. | 156/630 |
| 4,808,324 | 2/1989 | Périard et al. | 252/23 |
| 4,818,437 | 4/1989 | Wiley | 252/511 |
| 4,818,438 | 4/1989 | Wiley | 252/511 |
| 4,874,477 | 10/1989 | Pendleton | 204/15 |
| 4,879,015 | 11/1989 | Adamek et al. | 204/224 R |
| 4,889,750 | 12/1989 | Wiley | 428/34.2 |
| 4,897,164 | 1/1990 | Piano et al. | 204/15 |
| 4,911,796 | 3/1990 | Reed | 204/15 |
| 4,921,777 | 5/1990 | Fraenkel et al. | 430/314 |
| 4,935,109 | 6/1990 | Dugan | 204/15 |
| 4,964,948 | 10/1990 | Reed | 156/659.1 |
| 4,964,959 | 10/1990 | Nelsen et al. | 204/15 |
| 4,969,979 | 11/1990 | Appelt et al. | 204/15 |
| 4,980,202 | 12/1990 | Brennan et al. | 427/249 |
| 4,994,153 | 2/1991 | Piano et al. | 204/15 |
| 5,015,339 | 5/1991 | Pendleton | 204/15 |
| 5,024,735 | 6/1991 | Kadija | 204/15 |
| 5,030,367 | 7/1991 | Tanaka et al. | 252/22 |
| 5,032,235 | 7/1991 | Downing et al. | 204/15 |
| 5,041,242 | 8/1991 | Fowle et al. | 252/511 |
| 5,106,537 | 4/1992 | Nelsen et al. | 252/502 |
| 5,108,553 | 4/1992 | Foster et al. | 205/125 |
| 5,110,355 | 5/1992 | Pendleton | 106/1.11 |
| 5,139,642 | 8/1992 | Randolph et al. | 205/125 |
| 5,277,787 | 1/1994 | Otani et al. | 205/125 |

OTHER PUBLICATIONS

Rohm and Haas, Rohm and Haas Products For the Graphic Arts Industry, Acrysol I–1955, Rohm and Haas Company, 1988 (no month).

Olin Hunt Specialty Products Inc. Operating Bulletin Rev. 1 (Jul. 1991), Olin Hunt, Blackhole Vertical Process.

Olin Hunt Specialty Products Inc. Operating Bulletin Rev. 1 (Jul. 1991), Olin Hunt, Blackhole Conveyor System Process II.

Lal et al., J. Appl. Chem. Biotech. 1975, vol. 25, No. 12, 881–890, Thermal conductivity of suspensions and emulsion materials (no month).

Printed Circuits Handbook, Chapter 13, Dr. Hayao Nakahara, pp. 13.1–13.17 (no date).

Kirk Othmer, vol. 1, pp. 298–302, 312–313, 330–333, 386–388, 394–396, 427, 430 (no date).

Kirk Othmer, vol. 4, pp. 535–555 (no date).

Kirk Othmer, vol. 4, pp. 556–558 (no date).

Kirk Othmer, vol. 4, pp. 631–636 (no date).

Kirk Othmer, vol. 9, pp. 267–272, 274–280, 286, 288 (no date).

Kirk Othmer, vol. 20, pp. 197–198, 200–201, 207–227 (no date).

Hoyu, Hair dyeing agent—contg. e.g. triphenlmethane agent and/or azo agent and/or quinoline agent and carbon black, Abstract No. JP 8870398, Mar. 24, 1988.

Mednikov et al., Forming aq. dispersions of carbon black using acrylic! or methacrylic! acid copolymer as dispersant to improve storability, Abstract SU 768793, Nov. 10, 1980.

Jara et al., Separation of carbon black from aqueous suspension, Abstract No. 906226f, 60–Sewage, Wastes vol. 91, 1979, p. 299 (Mar.).

Takashina et al., Carbon black composition dispersible in water, Abstract No. 138303p, Chemical Abstracts, vol. 79, 1973, p. 60 (no month).

Shestakova et al., Effect of the salt composition of process water on pH of aqueous carbon black suspension, Abstract No. 009722a, 61–Water, vol. 79, 1973, p. 307 (no month).

Moraru et al., Adsoprtion of exeythylated nonionic surfactants and its effect on the stability of aqueous dispersions of graphite, Abstract No. 084887e, 66–Surface Chem., Colloids, vol. 102, 1985, p. 397 (no month).

No–Author, Thermally–expanded graphite for addition to coatings, JP 02/153811, 1990 (no month).

Chiyoda et al., Coating composition based on graphite for the interior wall of a picture tube, Abstract No. CA 94(24):201807h CA, Apr. 9, 1981.

Suzuki, Formation of conductive coated film, Abstract No. JP 61/161181, Jul. 21, 1986.

Ozaki et al., Conductive water–disperse coating, Abstract No. JP 60/156769, Aug. 16, 1985.

Deyama, Water–resistant, electrically conductie paint, Abstract No. JP 58/194962, Nov. 14, 1983.

Sako et al., Electrically conductive paint composition, Abstract No. JP 58/132058, Aug. 6, 1983.

Yoshimura et al., Electrically conductive coating composition, Abstract No. JP 58/025368, Feb. 15, 1983.

Derwent World Pat., Aq. graphite–water glass dispersion coating matl.—for forming black matrix layer on the image surface of colour tubes, Abstract: JP 76/005856, Feb. 23, 1976.

Bauer et al,. Stable aq. very fine graphite past prodn. from graphite powder—by dispersing in water contg. surfactant and ammonia, dilution, sepn, and concn., Abstract No. DD 294589, Oct. 2, 1991.

Lubricant composn. for high temps.—contains powdered graphite, water, and as binder, water–soluble polymer and water–dispersible polymer, Abstract No. JP 2051592, Jan. 21, 1990.

Akhremenko et al., Lubricant for roller–lesss conveyor belt moving in groove—contains graphite, foaming agent, and additional alkali salts of higher fatty acids, to stabilise lubricating properties, Abstract No. SU 1498786 Aug. 7, 1989.

Sokirko et al., Lubricant for hot pressure forming of metals—contains graphite, fireclay, additional synthetic detergent, and water, Abstract No. SU 1579929 Jul 23, 1990.

Water–colloidal grpahite disperse systems, Sandu, et al., Abstract: CA106(16):126512u 1986 (no month).

Dow Chemical Co., *Selecting The Best Versene Chelating Agent*, (undated).

Sandoz Chemicals, *Water Soluble Polymers*, (undated).

Exxon Chemical, *Callaway* 6818, May 30, 1991.

Adsorption of Phenol on Surface–modified Carbon Black from Its Aqueous Solution. II. Influence of Surface–Chemical Structure of Carbon on Adsorption of Phenol[1], 1985 The Chemical Society of Japan, Bull. Chem. Soc. Jpn., 58, 2009–20014, Asakawa et al. (Jul.).

3M Industrial Chemical Products Division, *Fluorad Fluorochemical Surfactant* FC–120, Mar. 1992.

Van Deraerschot, Separation of carbon black from aqueous suspensions, Abstract No. 91:76784h, Chemical abstracts, vol. 91, 1979 p. 134 (May).

Metal Lub. Grafo 1240B Interim Data Sheet (undated).

Grafo, Bulletin, Dispersion Of Graphite And Other Solids For Industrial Coating Applications (undated).

Honda, Motor Co., Coating materials for metal melt–casting molds, CA102(20):171023P, Dec. 27, 1984.

Ryzhkov, et al., Parting coating, CA81(20):125232f, Dec. 1, 1971.

No Author, Electrically conductive coating composition, Abstract EP085413, (undated).

CA112(16):141269n filed Nov. 1989 USSR abstract only.

CA112(20):190074d filed Jan. 1989 Czech abstract only.

PROCESSES FOR PREPARING A NON-CONDUCTIVE SUBSTRATE FOR ELECTROPLATING

CROSS-REFERENCE TO RELATED APPLICATIONS

This is a continuation-in-part of United States Application Serial No. 08/062,943, filed May 17, 1993, now U.S. Pat. No. 5,389,270. The entire specification and all the claims of that application are hereby incorporated by reference herein to provide continuity of disclosure.

TECHNICAL FIELD

The present invention is directed to electrically conductive coatings containing carbon and processes for preparing electrically nonconductive surfaces for being electroplated. More particularly, one aspect of the invention relates to preparing the non-conductive surfaces in the through holes of a multi-layer or double-sided printed wiring board for electroplating.

BACKGROUND ART

Printed circuit boards are formed from a layer of conductive material (commonly, copper or copper plated with solder or gold) carried on a substrate of insulating material (commonly glass-fiber-reinforced epoxy resin). A printed circuit board having two conductive surfaces positioned on opposite sides of a single insulating layer is known as a "double-sided circuit board." To accommodate even more circuits on a single board, several copper layers are sandwiched between boards or other layers of insulating material to produce a multi-layer circuit board.

To make electrical connections between the circuits on opposite sides of a double-sided circuit board, a hole is first drilled through the two conducting sheets and the insulator board. These holes are known in the art as "through holes." Through holes are typically from about 0.05 mm to about 5 mm in diameter and from about 0.025 mm to about 6 mm. long. The through hole initially has a nonconductive cylindrical bore communicating between the two conductive surfaces on opposite sides of the board. A conductive material or element is positioned in the through hole and electrically connected with the conducting sheets on either side of the through hole.

Like double-sided circuit boards, multi-layer circuit boards also use holes in an intervening insulating layer to complete circuits between the circuit patterns on opposite side of the insulating layer. Unless the context indicates otherwise, references in this specification to "through holes" refer to these holes in multilayer boards as well, even if they do not literally go through the entire circuit board.

Various conductive elements have been devised over the years for forming a conductive pathway via the through hole. Initially, conductive solid parts (e.g., rivets or eyelets) were inserted through the through holes and mechanically secured in place. However, these parts were labor intensive to install and proved unreliable with age. Jumper wires running around the edge of or through the board and the leads of conductive elements soldered to the board have also been used.

More recently, conductive material—typically, a layer of copper—has been coated on the nonconductive through hole bore to provide a cylindrical bridge between the conducting sheets which lie at the opposite ends of the through hole. Electroplating is a desirable method of depositing copper and other conductive metals on a surface, but electroplating cannot be used to coat a nonconductive surface, such as an untreated through hole. It has thus been necessary to treat the through hole with a conductive material to make it amenable to electroplating.

One process for making the through hole bores electrically conductive, to enable electroplating, is to physically coat them with a conductive film. The coated through holes are conductive enough to electroplate, but typically are not conductive and sturdy enough to form the permanent electrical connection between the conductive layers at either end of the through hole. The coated through holes are then electroplated to provide a permanent connection. Electroplating lowers the resistance of the through hole bore to a negligible level which will not consume an appreciable amount of power or alter circuit characteristics.

Conductive through hole coating compositions containing nonmetallic, electrically conductive particles have long been sought to avoid the expense and disposal problems associated with metal deposition. The only common nonmetallic conductors are graphite and carbon black. Of these two, graphite is far more conductive, so the art has long sought to make a graphite dispersion which is suitable for coating a through hole with a conductive layer of graphite. Graphite dispersions, however, have been found unsuitable for preparing through holes for electroplating.

U.S. Pat. No. 3,163,588 (Shortt), which issued on Dec. 29, 1964, briefly suggests that a through hole surface may be rendered conductive prior to electroplating by applying a paint or ink containing a substance such as graphite. Col. 3, ln. 57–58.

U.S. Pat. No. 3,099,605 (Radovsky), which issued on Jul. 30, 1963, states, however, that the prior use of graphite to form a conductive base coating on the exposed areas of a through hole suffered from many "defects." Col. 1, ln. 66. These defects were said to include the "lack of control of the graphite application with the resultant poor deposit of the electroplated metal and non-uniform through hole diameters." Col. 1, ln. 66–70.

U.S. Pat. No. 4,619,741 (Minten) teaches that "when graphite particles are used . . . loss of adhesion of the copper to the non-conducting material after the subsequent electroplating was noted." Col. 7, ln. 11–16. In comparison 1 of the '741 patent, through holes that were electroplated after application of the first substitute graphite formulation (2.5% by weight graphite) had only a few visible voids, "but failed the solder shock test." Col. 20, ln. 5–7. According to the '741 patent, "[t]he plated on copper in the holes pulled away from the epoxy/glass fiber layer." Col. 20, ln. 7– 8. The results were even worse with the second substitute graphite formulation (0.5% by weight graphite). After electroplating, the boards that were treated with the second substitute formulation had voided holes. See: col. 20, ln. 14. According to the '741 patent, "[t]he standard shock test could not be run on boards that were prepared with this latter graphite formulation because of the lack of unvoided holes." Col. 20, ln. 14–16.

U.S. Pat. No. 5,139,642 (Randolph), which issued on Aug. 18, 1992, contains comparative examples 3A and 3B in which a graphite dispersion was coated in a single pass on a through hole and dried to form a graphite layer directly on the nonconductive substrate. The substrate was then subjected to a through hole electroplating process. The test was a failure: the patent states that "[t]his board (C-3B) was not evaluated for adhesion since significant voids were observed even after 55 mins. of plating."

A competing process for plating through holes has been to use electroless copper—a solution which plates metal through chemical action, requiring no electricity, and which thus will deposit conductive metal on a nonconductive substrate. Electroless copper can plate copper directly on the through hole to make it conductive. Then, typically, electroplating is used to build up the coating, providing a permanent conductive path.

U.S. Pat. No. 4,619,741 (Minten), which issued on Nov. 11, 1986, teaches that, since about 1961, the industry had relied upon electroless copper deposition to prepare the walls of a through hole for electroplating. Col. 1, ln. 25–28. Although electroless deposition provided superior results to the prior art methods for preparing a through hole surface, electroless deposition has several commercial disadvantages. As pointed out by Minten, these disadvantages include a six step process prior to electroplating; a long process time; multiple treatment baths; a "complex chemistry which may require constant monitoring and individual ingredients which may require separate replenishment;" a "palladium/tin activator [which] also may require extensive waste treatment;" and a "multiplicity of rinse baths [which] may require large amounts of water." Col. 1, ln. 66, to col. 2, ln. 7.

Radovsky, cited previously, nonetheless states that the electroless plating method "has advantages over the graphite methods."Col. 2, ln. 10–12. "[The] advantages are essentially better control over the base layer of catalyst metal deposition and a resultant improved electroplating process with more uniform hole diameters." Col. 2, ln. 12–15.

To overcome the disadvantages associated with the electroless and graphite deposition methods, U.S. Pat. 4,619,741 (Minten), cited above, teaches coating the non-conductive surface of a through hole wall of a printed circuit board with carbon black particles prior to electroplating. The '741 patent expressly teaches that "graphite particles" are not capable of substituting for the carbon black particles. According to the '741 patent, "both graphite formulations were far inferior for electroplating preparation as compared to the above carbon black formulations." Col. 20, ln. 17–19.

The following U.S. patents also teach that graphite is not a substitute for carbon black in carbon black formulations that conductively coat through holes prior to electroplating: U.S. Pat. No. 4,622,108 (Polakovic: one of the present inventors) at col. 8, ln. 1–5; U.S. Pat. No. 4,631,117 (Minten) at col. 7, ln. 24–28 ("when graphite particles are used as a replacement for the carbon black particles of this invention, the undesirable plating characteristics mentioned in U.S. Pat. No. 3,099,608 would likely occur"); U.S. Pat. No. 4,718,993 (Cupta) at col. 8, ln. 27–37; and U.S. Pat. No. 4,874,477 (Pendleton) at col. 7, ln. 60–68.

In addition, the following U.S. patents discuss the deficiencies associated with using graphite as a conductive coating prior to electroplating: U.S. Pat. Nos. 4,619,741 at col. 2, ln. 16–25; 4,622,108 at col. 2, ln. 12–20; 4,622,107 at col. 1, ln. 52–60; 4,631,117 at col. 2, ln. 22–30; 4,718,993 at col. 2, ln. 21–29; 4,874,477 at col. 1, ln. 54–62; 4,897,164 at col. 1, ln. 54–62; 4,964,959 at col. 1, ln. 28–36; 5,015,339 at col. 1, ln. 56–64; 5,106,537 at col. 1, ln. 34–42; and 5,110,355 at col. 1, ln. 60–68. According to these patents, the deficiencies with the graphite process included lack of control of the graphite application, poor deposit of the resultant electroplated metal, non-uniform through hole diameters, and high electrical resistance of the graphite.

The carbon black process is commercially available under the BLACKHOLE trademark from MacDermid Incorporated of Waterbury, Conn. It is difficult to make the BLACKHOLE process work, however, and it provides a coating with an undesirably high electrical resistance. All the current used for electroplating must flow through the carbon black coating, so, for a given voltage, the current flow through a high resistance coating is relatively low. The rate of electroplating is proportional to the current flow, so a high resistance coating requires a long plating time to plate the desired quantity of metal over the carbon black coating. The voltage drop across the high resistance coating also consumes electricity by generating heat.

The electrical resistivity problem with the carbon black process has been addressed commercially in the BLACKHOLE process by depositing a second coat of carbon black over the first to further lower the resistivity of the coating. Of course, this two-pass process requires more materials, time, and equipment than a one-pass process.

The Randolph patent cited previously teaches that the deficiencies of a single graphite layer or a single carbon black layer can be avoided by applying an aqueous dispersion of carbon black directly to the through hole, removing the water to leave a carbon black film, then applying an aqueous dispersion of graphite to the carbon black film, and finally removing the water to form a second, graphite film. The carbon black film acts as a primer for the graphite film to increase adhesion, while the graphite layer is more electrically conductive and thus lowers the resistivity of the composite coating. But a two-pass process is again required.

DISCLOSURE OF INVENTION

Accordingly, an object of the present invention is to develop a method of depositing a controlled and uniform coating of graphite or carbon black (which are referred to in this specification either together or separately as "carbon") particles on the non-conductive surface of a through hole. As used herein, a "uniform" coating is one essentially free of excess conductive coating composition build up, particularly at the ends of the through hole, so the coating has a substantially uniform thickness at the mouth and in the interior of the hole, as viewed under a 50× magnification of a cross-section of a through hole after plating.

Another object of the present invention is to uniformly deposit a particulate carbon coating which is adequate to eliminate the need for electroless plating prior to electroplating.

An additional object of the invention is to provide a conductive coating with good adhesion to a nonconductive substrate, for example, a coating which adheres to a through hole wall better than coatings of palladium, electroless copper, carbon black, or graphite provided by prior through hole coating process and compositions.

Still another object of the present invention is to provide an electroplated conductive through hole coating which is capable of withstanding the solder shock test.

A still further object of the invention is to provide a conductive carbon coating with a low resistivity.

Yet another object of the invention is to provide a particulate coating which can provide lower resistivity in a one-pass process than has previously been possible.

Other objects of the invention will become apparent to one skilled in the art who has the benefit of this specification and the prior art.

At least one of these alternative objects is achieved by an improved process for electroplating a conductive metal layer, such as copper, on the surface of a non-conductive material. A liquid dispersion is prepared comprising carbon, a water-dispersible binding agent, and an aqueous dispersing medium, The composition has a pH within the range of from about 4 to about 14. The liquid dispersion is applied to the non-conductive surfaces of the through hole. Substantially all of the aqueous dispersing medium is separated from the carbon particles, depositing the carbon particles on the non-conductive surfaces of the through hole in a substantially continuous layer. After that, a substantially continuous metal layer is electroplated over the carbon particles deposited on the previously non-conductive surfaces of the through hole.

Another aspect of the invention is a method for electroplating a conductive metal layer to the non-conductive surface of a through hole, comprising the previously stated steps. However, before the aqueous dispersing medium is separated (e.g. dried) from the carbon particles, the through hole is contacted with a fixer comprising an aqueous solution of from about 0.1% to about 5% by volume of an aqueous acid. The coating is then dried, and a substantially continuous metal layer is electroplated over the dispersion coating.

These improved methods are capable of depositing a uniform coating of carbon on the non-conductive surfaces of a through hole of either a double-sided or a multi-layer circuit board. Through holes that are treated with the carbon dispersions and methods of the present invention prior to electroplating can be made at least substantially free, and preferably entirely free, of visible voids. ("Substantially free of visible voids" means that, following electroplating, the proportion of plated through hole area is at least about 90% of the entire area.) Through holes that are treated with the carbon dispersion of the present invention prior to electroplating can also have a substantially uniform diameter. This means that visible lumpiness or pullaway of the coating from the substrate is at least substantially eliminated, or is (at a minimum) better than those characteristics of prior carbon formulations. The electroplating process which follows the carbon treatment can be carried out more quickly.

MODES FOR CARRYING OUT THE INVENTION

In its first aspect, the present invention is directed to each of the conductive dispersions described in the Description of the Invention section above. A detailed description of the ingredients of the dispersions follows.

Carbon

One component of the compositions of the present invention is carbon, in the form of carbon black, graphite, or combinations of the two. Graphite is different from carbon black. Carbon black particles are amorphous. In contrast, graphite particles are highly crystalline. Typically, carbon black particles are impure, frequently being associated with 1–10% volatiles. See U.S. Pat. No. 4,619,741 at col. 7, ln. 5–11. In contrast, graphite is relatively pure, particularly synthetic graphite.

The carbon may be present as from about 0.1 to about 20% by weight, alternatively from about 0.5 to about 10% by weight, alternatively from about 1% to about 7% by weight, alternatively from greater than about 4% to about 6.5% by weight of the composition.

The carbon may have a mean particle size within the range from about 0.05 to about 50 microns, alternatively from about 0.3 to 1.0 microns, alternatively from about 0.7 to about 1.0 microns. From the perspective of performance and ease of dispersion, particles from the smaller end of the size range are preferred. However, the smaller particles, particularly graphite particles, are more costly. Graphite particles of suitable size can be prepared by the wet grinding or milling of raw graphite, having a particle size greater than 50 microns, to form a slurry of smaller particles. Graphite particles of suitable size can also be formed by graphitizing already-small carbon-containing particles.

The inventors have found it unnecessary to obtain graphite having mean particle sizes substantially less than one micron, contrary to the conventional belief that extremely fine graphite is necessary.

If both carbon black and graphite are used, the carbon black may have a substantially smaller particle size (for example, a sub-micron average diameter) than the graphite (for example, an about one micron or greater number-average diameter). The ratio of graphite to carbon black may be at least about 1:100, or at least about 1:10, or at least about 1:3, or at least about 1:1, or at least about 3:1, or at least about 6:1, or at least about 10:1, or at least about 20:1, or at least about 50:1, or at least about 100:1, or at most about 1:100, or at most about 1:10, or at most about 1:3, or at most about 1:1, or at most about 3:1, or at most about 6:1, or at most about 10:1, or at most about 20:1, or at most about 50:1, or at most about 100:1, each ratio being a weight-weight ratio.

While not bound by any theory as to why the admixture of carbon black and graphite may be desirable, the inventors submit that graphite and carbon black may be synergistic in the contemplated coating compositions because graphite is more conductive but hard to grind to sub-micron size, while carbon black is normally sub-micron-sized but less conductive. The smaller carbon black particles may lodge and form low-resistance paths in the interstices between the larger graphite particles, thus reducing the interstitial electrical resistance of the coating.

The carbon black useful herein can be substantially as described in U.S. Pat. No. 5,139,642. The carbon black description of that patent is hereby incorporated herein by reference in its entirety. Several commercial carbon blacks contemplated to be useful herein include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich.; COLUMBIAN RAVEN 3500, made by Columbian Carbon Co., New York City, N.Y.; and other conductive carbon blacks having similar particle sizes and dispersion characteristics.

The graphite useful herein can be substantially as described in U.S. Pat. No. 5,139,642. The graphite description of that patent is hereby incorporated herein by reference in its entirety. In the compositions of the present invention, the graphite may be either synthetic or naturally occurring. Accordingly, suitable commercial graphites and graphite dispersions contemplated to be useful herein include: ULTRAFINE GRAPHITE, sold by Showa Denko K.K., Tokyo, Japan; AQUADAGE E; MICRO 440, sold by Asbury Graphite Mills Inc., Asbury, N.J.; GRAPHITE 850, also sold by Asbury; GRAFO 1204B, sold by Metal Lubricants Company, Harvey, Illinois; GRAPHOKOTE 90, sold by Dixon Products, Lakehurst, N.J; NIPPON AUP (0.7 micron), sold by Nippon Graphite Industries, Ltd., Ishiyama, Japan; and others having similar electrical and dispersion characteristics.

However, synthetic graphite is preferred. Synthetic graphite is formed by heat treating (graphitizing) a carbon source at temperatures exceeding 2400° C. The most conductive and most preferred graphite (electronic grade) is prepared at very high graphitization temperatures (~3000° Kelvin).

In the composition of the present invention, the conductivity of the carbon is important. When carbon is deposited on the non-conductive surface of a through hole, it is both the conductivity of the carbon particles and their uniform deposition which enable the carbon deposit, as a whole, to act as a cathode and to uniformly electroplate a conductive metal layer thereon.

While the inventors presently prefer graphite dispersions, many aspects of the present invention also improve the performance of carbon black dispersions.

Aqueous dispersions of carbon black, graphite, or both, are well known in the art and in related arts, such as lubricating compositions and conductive coatings for other purposes. One skilled in this art is readily able to formulate and prepare such dispersions.

Binding Agent

Another component of some of the compositions of the present invention is a water soluble or dispersible binding agent for binding the carbon particles. The binding agent is believed to assist the dispersed carbon particles in adhering to the surface of the non-conductive (i.e., dielectric) substrate which is to be made conductive for electroplating. The binding agent may be present as from about 0% to about 15% by weight, or from about 0.2 to about 10% by weight, or from about 0.5% to about 6% by weight, or from about 1.5% to about 3% by weight, of the composition for binding to the carbon particles.

The binding agent of the present invention is preferably any natural or synthetic polymer, polymerizable monomer, or other viscous or solid material (or precursor thereof) that is capable of both adhering to the carbon particles and of receiving an anionic dispersing agent (as described below). For example, the binding agent may be a water soluble or water dispersible material selected from the group consisting of mono- and polysaccharides (or, more broadly, carbohydrates) and anionic polymers. Typically, for purposes of this invention, a 2% by weight aqueous test solution of the binding agent will have a viscosity within the range of 25–800 cps at 25° C., although other concentrations of the binding agent and other viscosities of the complete through hole coating composition are also contemplated herein.

Monosaccharide binding agents contemplated for use herein include tetroses, pentoses, and hexoses. Polysaccharide (which for the present purposes includes disaccharide and higher saccharide) binding agents contemplate for use herein include sucrose (from beets, sugarcane, or other sources), maltose, fructose, lactose, stachyose, maltopentose, dextrin, cellulose, corn starch, other starches, and polysaccharide gums. Polysaccharide gums contemplated for use herein include agar, arabic, xanthan (for example, KELZAN industrial grade xanthan gum, available from the Kelco Div. of Merck & Co, Inc. of Rahway, N.J.), pectin, alginate, tragacanath, dextran, and other gums. Derivative polysaccharides contemplated for use herein include cellulose acetates, cellulose nitrates, methylcellulose, and carboxymethylcellulose. Hemi-cellulose polysacharides contemplated for use herein include d-gluco-d-mannans, d-galacto-d-gluco-d-mannans, and others. Anionic polymers contemplated herein include the alkylcelluloses or carboxyalkylcel luloses, their low- and medium-viscosity alkali metal salts (e.g. sodium carboxymethylcellulose, or "CMC"), cellulose ethers, and nitrocellulose. Examples of such anionic polymers include KLUCEL hydroxypropylcellulose; AQUALON CMC 7L sodium carboxymethylcellulose, and NATROSOL hydroxyethyl cellulose, which are all commercially available from Aqualon Company of Hopewell, Va.; ethylcellulose, available from Hercules of Wilmington, Del.; METHOCEL cellulose ethers, available from Dow Chemical Co., Midland, Mich.; and nitrocellulose, which is also available from Hercules.

The acrylics contemplated herein for use as binding agents include polymerizable monomers and polymers, for example, emulsion polymers commonly known as acrylic latices. The monomers include acrylamide, acrylonitrile, acrylic acid, methacrylic acid, glycidyl methacrylate, and others. The acrylic polymers include polymers of any one or more of the foregoing monomers; polyacrylamide polymers such as SEPARAN NP10, SEPARAN MGL, SEPARAN 870, and SEPARAN MG200 polymers; polyacrylic acid; acrylic ester polymers such as polymethyl acrylate, polyethyl acrylate, polypropyl acrylate, polyisopropyl acrylate, polybutyl acrylate, polyisobutyl acrylate, polypentyl acrylate, polyhexyl acrylate, polyheptyl acrylate, polyoctyl acrylate, and polyisobornyl acrylate; and other polyacrylates. Suitable acrylics available to the trade include NALCO 603, PURIFLOC C31, and ACRYSOL acrylics sold by Rohm and Haas Company of Philadelphia, Pa.

Other binding agents are also contemplated herein. The vinyl resins contemplated herein include polyvinyl acetates, polyvinyl ethers, and polyvinyl chlorides. The pyrrolidinone resins contemplated herein include poly(N-vinyl-2pyrrolidinone). Representative trade materials of this kind are PVP K-60 resin, PVP/VA E335 resin, PVP/VA 1535 resin, and other resins sold by GAF Corporation. The polyols contemplated herein include polyvinyl alcohols. The polyvinyl alcohols contemplated herein include ELVANOL 90-50, ELVANOL HV, ELVANOL 85-80, and others.

Cationic resins and other materials contemplated for use herein as binding agents include polyethylenimine, methylaminoethyl resins, alkyltrimethylammonium chlorides, and others. Esters of olefinic alcohols, aminoalkyl esters, esters of ether alcohols, cycloalkyl esters, and esters of halogenated alcohols are also contemplated for use as binding agents. Polyethylene oxides, such as materials available under the trade names NSR N-10, NSR N3000, and NSR 301 from Union Carbide Corp., are contemplated herein.

Still more binding agents contemplated herein include epoxy resins, cresol novolac resins, phenol novolac resins; epichlorohydrin resins; bisphenol resins; phenolic resins, such as DURITE AL-5801A resin available from Borden Packaging and Industrial Products of Louisville, Ky.; and natural resins and polymerizable materials such as damar, manila, rosin gum, rosin wood, rosin tall oil, and others.

A practical upper limit to the amount of binding agents used is contemplated to be that amount which materially interferes with the conductivity of the resulting conductive coatings by diluting the conductive solids in the composition after it is deposited as a film.

Dispersing Agent

Another component of some of the compositions of the present invention is an anionic dispersing agent. The anionic dispersing agent has a molecular weight less than about 1000 Daltons, so it is a substantially smaller molecule than the binding agent.

The anionic dispersing agent has a hydrophobic end and a hydrophilic (anionic) end. It functions by surrounding the bound carbon particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound carbon particle has sufficient dispersing agent bound to it, the sphere of anionic charges surrounding each particle causes the particles to repel one another, and thus, to disperse.

The amount of anionic dispersing agent that is contemplated in the composition of the present invention is an amount sufficient to cause the bound carbon particles to disperse in the aqueous dispersing medium. The amount of dispersing agent that is used is dependent upon the size of the carbon particle and the amount of binding agent bound thereto. As a general rule, smaller carbon particles require lesser amounts of dispersing agent than would be required to disperse larger particles. To determine the amount of dispersing agent that is required in any particular case, one of ordinary skill in the art can begin by adding ever increasing amounts of dispersing agent to the bound carbon particles until a sufficient amount is added to cause the particles to disperse. This amount of dispersing agent is the minimum effective amount of dispersing agent. Increasing amounts of dispersing agent could be added without adversely affecting the dispersion of the carbon particles. To ensure that the particles remain dispersed, one could add a ten percent greater amount of dispersing agent than is needed. Thus, for purposes of the present invention, the amount of anionic dispersing agent that is used in the composition of the present invention must be an amount that is effective for dispersing the bound carbon particles. For example, the anionic dispersing agent may be present as from about 0% to about 10% by weight, alternatively from about 0.01% to about 5% by weight, alternatively from about 0.1% to about 2% by weight of the composition.

A practical upper limit to the amount of anionic dispersing agents used is contemplated to be that amount which materially interferes with the conductivity of the resulting conductive coatings by diluting the conductive solids in the composition after it is deposited as a film.

Suitable anionic dispersing agents include acrylic latices, aqueous solutions of alkali metal polyacrylates, and similar materials. Specific dispersing agents contemplated herein include ACRYSOL I-1955 and ACRYSOL I-545 dispersing agents, both of which are commercially available from the Rohm and Haas Co., Philadelphia, Pa. The ACRYSOL dispersing agents may be used alone or together, preferably together. A preferred weight ratio of ACRYSOL I-1955 to ACRYSOL I-545 is about 1:4.

Buffers

The composition and method of the present invention is capable of being run over a wide pH range. The present composition may have a pH within the range of from about 4 to about 14. An alternative pH range is from about 9 to about 11, another is from about 9.5 to about 10.5, and still another is from about 10.7 to about 11.

Preferably, the pH is maintained by a pH buffer. The buffer functions by precluding or minimizing changes in pH such as may occur during the course of a run as a large number of boards are treated with the composition of the present invention. The maintenance of a constant or nearly constant pH insures the composition is reproducible from board to board. Another advantage of using a buffer system is that the normalities of one or more buffer components can be measured and adjusted to maintain proper process control.

A pH in the preferred range can be provided by a carbonate-bicarbonate buffer. The use of other pH buffering systems, such as phosphate, acetate, borate, barbital, and the like, are well known in the art. The anions of the buffer may be associated with any suitable cation, such as an alkali metal cation, such as sodium, potassium, or lithium; or an ammonium cation.

Surfactants

An optional component of some of the compositions of the present invention is a surfactant. One function of the surfactant is to decrease the surface tension of the aqueous dispersing medium such that the aqueous dispersing medium containing the dispersed carbon particles is able to freely penetrate into the through holes. A second function of the surfactant is to wet the surfaces of the polymeric and glass substrates. This facilitates the coating of these surfaces with the carbon dispersion. The amount of surfactant that is used in any particular case will vary depending upon the surfactant itself. To determine the amount of surfactant that is required in any particular case, one can begin by adding about 0.1% by weight surfactant to the composition and increasing the amount until the desired performance is achieved. Although additional amounts of surfactant could be added, they might not provide any additional benefit.

The diameter of the through holes is typically within the range of 0.05 mm to 5 mm. With through hole sizes within the range of 4–5 mm, a surfactant may not be necessary. However, with through hole sizes below about 4 mm, an increasing amount of surfactant is recommended with decreasing through hole sizes. The circuit boards may vary in thickness (and thus their through holes may vary in length) from that of a double-sided circuit board to a multilayer circuit board having up to twenty-four layers. Thus, when needed, the composition of the present invention should contain sufficient surfactant to allow the aqueous dispersing medium to freely carry the dispersed carbon particles through the through holes in circuit boards having through holes of various sizes.

The composition typically contains from about 0.01% to about 10% by weight, or from about 0.02% to about 3% by weight, or from about 0.05% to about 1% by weight of the composition, of the surfactant.

Suitable surfactants for use in the present invention include TRITON X-100, sold by Rohm and Haas Co., Philadelphia, Pa.; MAPHOS 56, sold by Mazer Chemicals, Inc.; TAMOL 819L-43, 850, and 960 anionic surfactants, available from Rohm and Haas Co., Philadelphia, Pa.; FLUORAD® FC-120, FC-430, FC-431, FC-129, and FC-135 anionic fluorochemical surfactant; sold by Minnesota Mining & Manufacturing Co., St. Paul, Minn.; DARVANNO. 1, sold by R. T. Vanderbilt Co.; ECCOWET LF, sold by Eastern Color and Chemical; PETRO ULF, sold by Petro Chemical Co. Inc.; POLYTERGENT B-SERIES surfactant, sold by Olin Corporation; and others, Cationic and other surfactants may also be used, depending upon the pH and other characteristics of the composition.

Other surfactants contemplated to be suitable for use herein include DM-5, M-5, and M-10 polymeric dispersants or Colloid 211, 225, and 233 surfactants, sold by Rhone-Poulenc, Cranbury, N.J.; SURFINOL CT-136 and CT-141 surfactants, sold by Air Products and Chemicals, Inc., Allentown, Pa.; GRADOL 300 and 250 and HA and HAROL D surfactants, sold by Graden Chemicals Co. Inc., Havertown, Pa.; AEROSOL NS and OT-B surfactants, sold by American Cyanamid Co., Wayne, N.J.; and LIGNASOL B and BD, MARASPERSE N-22, and CBOS-3 and C-21 surfactants sold by Dashowa Chemicals Inc., Greenwich, Conn.

Aqueous Dispersing Medium

Another component of the compositions of the present invention is an aqueous dispersing medium. The phrase, "aqueous dispersing medium," as used herein, includes any solvent that is from 80 to 100% water wherein the balance of the material is a water soluble organic composition. Typical water soluble organic compositions include the low molecular weight alcohols, such as methanol, ethanol, and isopropanol. Additional organic molecules also include solvents such as dimethylsulfoxide, tetrahydrofuran, and ethylene or propylene glycol. Preferably, the aqueous dispersing medium is 100% water. Deionized water is preferred.

The resulting composition is a carbon dispersion that is capable of depositing a uniform, low resistivity coating of carbon particles on the non-conductive surfaces of a through hole. The composition of the present invention may be used "as is," or it may be sold in concentrate form and then diluted up to tenfold (10:1), preferably up to fourfold (4:1), at the point of use. The composition may be diluted with an aqueous dispersing medium, which may include one or more of a buffer, a dispersing agent, a surfactant, or other ingredients.

Process of Treating Through Holes

The present invention is also directed to a process for electroplating a conductive metal layer, such as copper, to the surface of a non-conductive material. In particular, the process of the present invention comprises:

(a) preparing any of the liquid dispersions of carbon, as described previously, which are capable of uniformly depositing a coating of carbon on the non-conductive surfaces of a through hole;

(b) applying the liquid dispersion to the non-conductive surfaces of a through hole to form a dispersion coating thereon;

(c) separating substantially all of the aqueous dispersing medium from the carbon particles, typically by drying the dispersion, so the carbon particles are deposited on the non-conductive surface in a substantially continuous layer; and (d) electroplating a substantially continuous metal layer over the carbon particles deposited on the non-conductive surface.

Although cleaning, conditioning, fixing, rinsing and drying steps are not included above, it is within the scope of the present invention to include rinsing steps between various reagent baths to prolong the life of the subsequent reagent baths. It is also within the scope of the present invention to include one or more drying steps, such as before an optional etching step as described in Example 13. Cleaning and conditioning steps are also necessary and conventional.

Preferably, between steps (b) and (c) of the above process, one may employ a fixing step. The fixing step is important in the treatment of printed circuit boards, since it makes the carbon dispersion more workable. The fixing step comprises applying a fixing solution to the dispersion coated surfaces of Step (b). The fixing solution removes excessive carbon composition deposits, crosslinks the first monolayer of carbon which is directly attached to the substrate, and thus smooths the carbon coating on the through hole surfaces by eliminating lumps and by making the coating more uniform. When the fixing step is utilized, the composition of the present invention is preferably run at a fourfold dilution.

In the fixing step, the fixing solution may be water, aliphatic or aromatic solvents, or a dilute aqueous acid. If water is used, the water must be warm (120°–140° F.) to effect fixing, whereas the dilute acid solution is capable of fixing the bound carbon at room temperature or warmer. Fixing is typically accomplished by a 30–60 second exposure of the carbon coating to the fixing solution. While not wishing to be bound by any theory, it is believed that the dilute acid fixer works faster or under milder conditions, particularly when sodium carboxymethylcellulose is the binder, by neutralizing or crosslinking the carboxyl groups, thereby causing the dispersed and bound carbon particles to precipitate on the through hole bore.

Typical acid fixing solutions include dilute aqueous solutions containing from 0.1–5% by volume of an acid. Convenient acids useful herein include mineral acids, such as hydrochloric, phosphoric, nitric, or sulfuric acid. Organic carboxylic acids, such as acetic acid, citric acid, and others, may also be used. A specifically contemplated fixing solution is a dilute aqueous solution of sulfuric acid, such as an aqueous solution containing 0.1–2% sulfuric acid by volume. Acidic fixing solutions that contain less than 0.1% acid may require some heat to effect fixing within the typical 30–60 second exposure.

An acid fixing bath contemplated for use herein contains sufficient acid to provide a pH of from about 0.01–6, alternatively from about 0.1 to about 4, alternatively about 0.7, which may be provided by using from about 0.1 to about 0.5% by volume of concentrated sulfuric acid in deionized water. The normality of the acid may be from 0.07N to 0.17N, alternatively from 0.01N to 1.0N, alternatively from 0.001N to 5N. The bath may be used at room temperature (for example, about 70° F. or 20° C.), or alternatively at from about 125° to about 135° F. (from about 52° to about 57° C.), or In one embodiment of the invention, this fixing step may be used with a carbon dispersion alone, without using all the adjuvants specified in the present composition inventions.

When the carbon coating process is complete, the deposited conductive coating is resistant to pullaway (which resembles a blister in the plating) and other adhesion defects, even when the most severe thermal shock tests are performed.

Printed Wiring Boards

Another aspect of the invention is a printed wiring board having conductive through holes, made by applying any of the compositions described above to a printed wiring board having one or more through holes, in accordance with any of the methods described above. The printed wiring board may have more than one coating, but preferably has a single layer, provided by a one-pass coating process, which provides the through holes with adequate conductivity for electroplating. This printed wiring board is then electroplated to provide a printed wiring board having copper clad through holes.

Resistance Measurements

The resistance of a printed wiring board which has been treated to make its through holes conductive is measured as an indication of the amount of time which will be required to electroplate the through holes. The lower the resistance, the more rapidly electroplating can proceed. The resistance of the through holes is conventionally measured by measuring the resistance between the two metal-clad surfaces on opposite ends of the through holes. Thus, one through hole resistance value is obtained for an entire printed wiring board before electroplating proceeds.

A single printed wiring board has many through holes of varying diameters. The number of through holes depends upon the size of the circuit board and the particular circuit it will carry. For example, a typical 18 inch by 24 inch (46 cm by 61 cm) board may have 3000 holes with diameters varying from about 6 mils (1.5 mm) to about 0.25 inch (6 mm). Also, a board may have a thickness of from about 1 mil (25 microns) to about 0.25 inch (6 mm.).

Multiple through holes create parallel conductive paths, so the net resistance of all the through holes on the board is less than the resistance of one through hole. The more through holes there are, the lower the resistance, other things being equal. The diameter of the through hole determines the cross-sectional area of its conductive surface, so a larger diameter through hole has a lower resistance than a smaller diameter through hole, other things being equal. The thickness of the board determines the length of each conductive through hole. The thicker the board, the longer each through hole and the higher its resistance, other things being equal.

Finally, "other things" are not equal, so even if the number and dimensions of the through holes are known, the resistance of each through hole cannot be directly calculated with any accuracy. Different through holes on the same board may have different coating thicknesses, the coating is applied on an irregular bore surface, fluid circulation in a bath to the various holes is different, and so forth.

Notwithstanding these many variations, the industry commonly draws conclusions about the conductivity of the through holes from a single resistance measurement per printed wiring board. For example, the 18 by 24 inch (46 by 61 cm) board referred to previously, coated with the preferred graphite composition according to the present invention in one pass, commonly has a resistivity of about one ohm through its through holes, which rises to about 10 ohms after microetching. The same board coated using the commercially available two-pass BLACKHOLE carbon black process has resistivities more than ten times as great, and sometimes 50 to 70 times as great, as those of the preferred graphite composition. Thus, where the resistance of a printed wiring board is given in this specification or in the claims, or if a resistance is given without specifying the manner of measurement, this single measurement, made prior to electroplating, is meant. Of course, if two boards have identical numbers, patterns, and sizes of through holes, the resistances of the entire boards can be directly compared to obtain useful results.

When the present invention is used to improve the through hole conductivity of an entire printed wiring board, the board has an electrical resistivity of less than about 1000 ohms, optionally less than about 600 ohms, optionally less than about 400 ohms, optionally less than about 250 ohms, optionally less than about 80 ohms, optionally less than about 60 ohms, optionally less than about 30 ohms, optionally less than about 10 ohms, optionally less than about 2 ohms, optionally less than about 1 ohm, each measured prior to electroplating the through hole.

One can also determine the resistance of a single through hole. This can be done in at least two ways. One way is to coat the through hole of a coupon (sample of metal-clad printed wiring board material which is not intended to be used in a circuit) or an actual printed wiring board which has only a single through hole, so the resistance of the board is the same as the resistance of that through hole. A second way is to isolate one through hole electrically by severing the cladding which links other through holes to the through hole which is being measured for resistivity. Thus, where the resistance of a through hole is given in this specification or in the claims, the resistance of a single through hole in electrical isolation, measured before electroplating, is meant.

When the present invention is used to improve the conductivity of an individual through hole, the treated through hole has an electrical resistivity of less than about 5000 ohms, optionally less than about 1000 ohms, optionally less than about 600 ohms, optionally less than about 400 ohms, optionally less than about 250 ohms, optionally less than about 80 ohms, optionally less than about 60 ohms, optionally less than about 30 ohms, optionally less than about 10 ohms, each measured prior to electroplating the through hole.

Coating Uniformity Determination

A thin, uniform coating of the carbon composition on the through holes is necessary so the plating which is deposited on the coating will not suffer from pullaway, particularly when subjected to the thermal shock of soldering.

The inventors contemplate that the coating ideally will be nearly as thin as the diameters of the dispersed particles of carbon, so it will form a monolayer of carbon particles. For example, a composition containing one-micron mean diameter particles would provide a film on the order of one micron thick. More particularly, the inventors contemplate a coating of from about one to about three microns thick. Thinner coatings are acceptable until the coating becomes so thin that complete coverage is not obtainable.

The inventors contemplate that coatings more than about 3 microns thick will start to present problems. Pullaway (a place where the plating delaminates) becomes more probable in this thickness range. A region of the coating as thick as about 7 microns is contemplated to be less desirable, while a coating of about 12 microns is contemplated to be still less desirable. When part of the coating becomes as thick as roughly 7 microns, it becomes visible when a 200 power (200× magnification) microscope is used to examine the plated through hole. Thus, another definition of the appropriate coating thickness is a coating which is too thin to see in a plated through hole cross-section under a 200 power microscope.

The degree of uniformity of the coating is sometimes expressed qualitatively by reporting that the coating in question exhibits, or is free of, lumpiness or localized areas having a thick coating of the carbon coating. Lumpiness (if present) typically is found at the entrance or exit of a through hole (i.e. at the corners of a rectangular cross-section of a cylindrical hole), and is manifested as visible (under a 50× microscope) non-uniform areas of plating projecting inwardly from the plane defined by the wall of the through hole bore. Expressed another way, a plated through hole bore is free of lumpiness if the plating appears to be a straight line down each side of the through hole connecting the conductive cladding at each end of the hole, when viewed in cross-section at 50× magnification.

The following examples are provided to describe specific embodiments of the invention and to demonstrate how it works. By providing those specific examples, the inventors do not limit the scope of the invention. The full scope of the invention is all the subject matter defined by the claims concluding this specification, and equivalents thereof.

EXAMPLE 1

Preparation of Cleaner/Conditioner Concentrate

1. To a beaker capable of containing a 1 liter volume, were added approximately 400 g of distilled or deionized water (hereinafter collectively "DI water") and 60 g of TERGITOL 15-S-9 secondary alcohol polyethylene glycol ether surfactant (sold by Union Carbide Corp., N.Y. City, N.Y.), and the mixture was stirred for about ten minutes. Thereafter, 100 g of monoethanolamine (Union Carbide) was added and the mixture was again stirred for about ten minutes. To the mixture was then added 300 g of the cationic water soluble polymer CALLAWAY 6818 (Exxon Chemical Company, Columbus, Ga.) and the mixture again was allowed to stir for approximately ten minutes. Thereafter, to the mixture was added 50 g of the cationic polyamidoamine SANDOLEC® CF (Sandoz Chemicals), and the mixture was allowed to stir for approximately ten minutes. To the mixture was then added 7 g of ethylene glycol and the mixture was allowed to stir for approximately ten minutes.

Thereafter, 10 g of tetrasodiumethylenediamine-tetraacetic acid (Na$_4$EDTA, sold as VERSENE 100 by Dow Chemical Company, Midland, Mich.), was added to the mixture, and the mixture was stirred for approximately ten minutes. Sufficient DI water was then added to bring the volume to 1 liter, and the mixture was stirred for about 10 minutes. The resulting cleaner/conditioner concentrate was considered acceptable if it exhibited a pH of 10 ± 0.4 and the specific gravity at 20/4° C. of 1.034 ± 0.007.

EXAMPLE 2

Preparation of the Working Cleaner/Conditioner

The working cleaner/conditioner was prepared by combining one volume of the cleaner/conditioner concentrate from Example 1 with 9 volumes of DI (deionized) water.

EXAMPLE 3

Cleaning and Conditioning Circuit Boards

Circuit boards having through holes were immersed for 4 to 6 minutes in a tank containing the working cleaner/conditioner solution at a temperature within the range of 140°–160° F. (60°–71° C.) a normality of 0.15 to 0.20, and a pH within the range of 9.5 to 11.8. The tank for the cleaner/conditioner solution was stainless steel, and it had a stainless steel heater element. Alternatively, a polypropylene tank could also be used.

EXAMPLE 4

Preparation of a Working Solution of the Carbon Dispersion

Colloidal graphite (19.9 wt. %) having a particle size of about 1 micron, was combined with 2.14 wt. % CMC 7L carboxymethylcellulose, 0.1% wt. TAMOL 819 surfactant, and water, forming a dispersion. The pH of the dispersion was 8.82, the viscosity (at 2060 rpm, 77° F.) was 145 cps, and the film resistivity of a 1 mil (25 micron) dried coating of the dispersion was 11.8 ohms per square.

200 g of the colloidal graphite dispersion and 790 g of DI water were mixed, and the mixture was stirred for approximately 20 minutes. To the mixture was then added 6 g of potassium carbonate (powder) and the mixture was stirred for approximately 15 minutes. Thereafter, 1 g of potassium bicarbonate crystals were added to the reaction mixture and it was mixed for about 15 minutes. The pH of the mixture was then measured to determine if it fell within the range of 10.7 to 11.0. For solutions having a pH above 11.0, additional potassium bicarbonate was added. For solutions having a pH below 10.7, additional potassium carbonate was added to bring it within the desired pH range of 10.7–11.0. When the solution was in the desired pH range, to it was added 0.2 g of the acrylic emulsion polymer ACRYSOL® I-1955 and 0.8 g of the acrylic emulsion polymer ACRYSOL® I-545 (Rohm and Haas), and the mixture was stirred for approximately 10 minutes. Thereafter, 1.2 g of the anionic fluorochemical surfactant FLUORAD® FC-120 was added to the mixture and the mixture was stirred for approximately 40 minutes.

The resulting solution was considered acceptable for use if the following criteria were met: percent solids fell within the range of 4.8 to 5.3%; the normality fell within the range of 0.11 to 0.17; and the pH fell within the range of 10.7 to 11.0.

EXAMPLE 5

Coating the Through Holes of a Circuit Board with Graphite Dispersion

The preferred equipment for the working dispersion bath comprises a polyethylene, polypropylene, or a stainless steel 316 tank. Such a tank is outfitted with a circulating centrifugal pump that is capable of turning over the tank volume three to six times per hour.

A circuit board having through holes was cleaned and conditioned by immersion for about 4–6 minutes in a bath at 130° F.–140° F. (about 54° to about 60° C.) containing the working cleaner/-conditioner solution of Example 3. Thereafter, the board was rinsed for about one minute in deionized water at ambient room temperature (65° F.–95° F.; 18° C.–35° C.). The rinsed board was immersed from four to six minutes in a bath containing the working graphite dispersion of Example 4 at ambient room temperature.

EXAMPLE 6

Comparison of the Resistance of Identical Panels Having Synthetic or Natural Graphite Uniformly Deposited Thereon 1. The Circuit Board Panels Fourteen identical circuit board panels ("panels") were used in this comparison. Each panel was a 3 inch (76 mm.) by 3 inch (76 mm.) square, and each had the same number and pattern of through holes.

2. The Graphite Dispersions

The graphite dispersions were prepared by dispersing the following coating-forming ingredients in a suitable amount of deionized water. The average particle sizes of the respective natural and synthetic graphite dispersions were measured and found to be comparable, though not the same as the average particle sizes reported by the vendors of the materials.

| Synthetic | Natural |
| --- | --- |
| 11.00 g Graphite (Micro 440)[1] | 11.00 g Graphite 850[2] |
| 0.44 g CMC 7M | 0.55 g CMC 7M |
| 0.60 g TAMOL 819 | 0.10 g TAMOL 819 |
| 2.00 g K$_2$CO$_3$ | 2.00 g K$_2$CO$_3$ |
| 1.00 g KHCO$_3$ | 1.00 g KHCO$_3$ |
| 1.00 g ACRYSOL I-1955 | 1.00 g ACRYSOL I-1955 |
| pH 10.66 | pH 10.5 |

[1] Asbury Graphite Mills Inc., Asbury, N.J.; Size reported by vendor: 0.44–0.55 microns.
[2] Asbury Graphite Mills Inc., Asbury, N.J.; Size reported by vendor: 3.74 microns (mean); 2–5 micron (range).

3. The Process

Both sample panels were run through the following steps:

| I. | Cleaner | 5 min. | 140° F. |
| --- | --- | --- | --- |
| II. | Rinse | 1 min. | Room Temp. |

|      |               |                                |                  |
| ---- | ------------- | ------------------------------ | ---------------- |
| III. | Conditioner   | 5 min.                         | Room Temp.       |
| IV.  | Rinse         | 1 min.                         | Room Temp.       |
| V.   | Graphite Disp.| 5 min.                         | Room Temp.       |
| VI.  | Dry           | 20 min.                        | 190° F.          |
| VII. | Micro Etch    | 50 micro inches removed        | Room Temp.       |
| VIII.| Rinse         | 1 min.                         | Room Temp.       |
| IX.  | Dry           | 10 min.                        | 190° F. (88° C.) |

4. Resistance Measurements

The resistivity of several comparable coupons coated with each composition was measured after drying step IX. Each panel was 3 inches (76 mm.) square, with the same pattern of through holes on each.

| Synthetic Graphite | Natural Graphite |
| --- | --- |
| Micro 440 (Asbury) | Graphite 850 (Asbury) |
| (1) 109 ohms | (9) 3000 ohms |
| (2) 85 ohms | (10) 1000 ohms |
| (3) 180 ohms | (11) 1100 ohms |
| (4) 210 ohms | (12) 1500 ohms |
| Average: 146 ohms | Average: 1650 ohms |
| #GraphoKote 90 (Dixon Products, Lakehurst, N.J.) (Vendor's reported size 80% >1 micron) | Graphite 450 (Asbury) (vendor's reported size 3.5–5.5 microns) |
| (5) 3.7 kilohms | (13) 20 kilohms |
| (6) 0.8 kilohms | (14) 19 kilohms |
| (7) 4.3 kilohms | (15) 59 kilohms |
| (8) 3.9 kilohms | (16) 26 kilohms |
| Average: 3.2 kilohms | Average: 31 kilohms |

The data in this Example demonstrates that a uniform deposit of synthetic graphite was many times more conductive than a comparable deposit of natural graphite.

EXAMPLE 7

Comparison of the Circuit Board Resistivity after Treatment By the Graphite Composition and Method of the Present Invention, and after Treatment by the Carbon Black Composition and Method of the '741 Patent 1. The Circuit Board Panels In Example 7, identical circuit board panels ("panels") were compared. The compared panels were of the multilayer type and of the double-sided type. Each panel was 3 inches (76 mm.) square. Each type of panel had the same number and pattern of through holes. The through hole diameters of each type of panel were 0.15–1.0 mm. Each multilayer panel had four layers of copper film.

2. The Carbon Black Process

The carbon black composition and process that was used in this comparison is commercially available under the trade name BLACKHOLE from MacDermid Incorporated, Waterbury, Conn. According to the manufacturer, the BLACKHOLE carbon black process requires a double pass through the process to obtain good results. The cleaners and conditions that were used in the carbon black process were those recommended by the manufacturer, i.e., BLACK HOLE CLEANER II and BLACK HOLE CONDITIONER.

Three variations of the carbon black technology are presented as Runs 1, 2, and 3 below. In the process of Run 1, duplicate multilayer and double-sided panels were subjected to the following sequence of steps:

| Carbon Black Process | | |
| --- | --- | --- |
| a) | Cleaner/Conditioner (2.5% v/v) | 5 minutes 135° F. (57° C.) |
| b) | Rinse | 1 minute Room Temp. |
| c) | Conditioner (2.5%) | 5 minutes Room Temp. |
| d) | Rinse | 1 minute Room Temp. |
| e) | Carbon Black Dispersion (BLACKHOLE) | 5 minutes Room Temp. |
| f) | Oven Dry | 20 minutes 190° F. (88° C.) |
| g) | Carbon Black Dispersion (BLACKHOLE) | 5 minutes Room Temp. |
| h) | Oven Dry | 5 minutes 190° F. (88° C.) |

The resistances of the first set of panels were measured between comparable points after Step (f) of the process of Run 1, representing a single pass.

| Resistance (Run 1) After Step (f) of Run 1 | |
| --- | --- |
| Panel | Resistance |
| (1) Multilayer | 3.6 kilohms |
| (2) Multilayer | 3.7 kilohms |
| (3) Multilayer | 1.2 kilohms |
| (4) Multilayer | 1.3 kilohms |
| (5) Double-sided | 1.9 kilohms |
| (6) Double-sided | 2.1 kilohms |
| (7) Double-sided | 1.2 kilohms |
| (8) Double-sided | 1.4 kilohms |

The resistances of a second set of panels were measured after Steps (f) (representing a single pass) and (h) (representing a double pass) of Run 1. These resistivities after the single pass and double pass stages of Run 1 are compared below.

| Comparative Resistance of Run 1 | |
| --- | --- |
| Resistance After Single Pass | Resistance After Double Pass |
| Multilayer Panels: | |
| (1) 5 kilohms | (1) 2.4 kilohms |
| (2) 6 kilohms | (2) 2.2 kilohms |
| Double-sided Panels: | |
| (3) 7 kilohms | (3) 2.0 kilohms |
| (4) 6 kilohms | (4) 1.9 kilohms |

Run 2 is identical to Run 1 except that a conditioning step (Step (g)) and a rinse step (Step (h)) were added below before the second application of the carbon black dispersion. The process of Run 2 was as follows:

| | | |
| --- | --- | --- |
| a) | Cleaner/Conditioner | 5 minutes 135° F. |

-continued

| | | |
|---|---|---|
| (2.5%) | | (57° C.) |
| b) Rinse | | 1 minute Room Temp. |
| c) Conditioner (2.5%) | | 5 minutes Room Temp. |
| d) Rinse | | 1 minute Room Temp. |
| e) Carbon Black Dispersion (BLACKHOLE) | | 5 minutes Room Temp. |
| f) Oven | | 20 minutes 190° F. (88° C.) |
| g) Conditioner (2.5%) | | 5 minutes Room Temp. |
| h) Rinse | | 1 minute Room Temp. |
| i) Carbon Black Dispersion (BLACKHOLE) | | 5 minutes Room Temp. |
| j) oven | | 20 minutes 190° F. (88° C.) |

Comparative Resistance After Single Pass and Double Pass of Run 2

| | Resistance | |
|---|---|---|
| Panel | After Single Pass | After Double Pass |
| Multilayer | (1) 5.5 kilohms | (1) 3.3 kilohms |
| Multilayer | (2) 6.4 kilohms | (2) 3.9 kilohms |
| Double-sided | (3) 6.9 kilohms | (3) 1.5 kilohms |
| Double-sided | (4) 4.5 kilohms | (4) 1.8 kilohms |

Run 3 employed Steps (a) through (f) of Run 1 and added a conventional microetching step (Step (g)). The microetching step removed 50 micro inches (1.27 microns) of copper. Thereafter, Steps (a) through (h) of Run 1 were repeated as Steps (h) through (m) of Run 3. The process of Run 3 was as follows:

| | | |
|---|---|---|
| a) Cleaner/Conditioner (2.5%) | 5 minutes | 135° F. (57° C.) |
| b) Rinse | 1 minute | Room Temp. |
| c) Conditioner (2.5%) | 5 minutes | Room Temp. |
| d) Rinse | 1 minute | Room Temp. |
| e) BLACKHOLE | 5 minutes | Room Temp. |
| f) Oven | 20 minutes | 190° F. (88° C.) |
| g) Microetch | | |

After microetch, the boards were processed through the same line again:

| | | |
|---|---|---|
| h) Cleaner/Conditioner (2.5%) | 5 minutes | 135° F. (57° C.) |
| i) Rinse | 1 minute | Room Temp. |
| j) Conditioner (2.5%) | 5 minutes | Room Temp. |
| k) Rinse | 1 minute | Room Temp. |
| l) BLACKHOLE | 5 minutes | Room Temp. |
| m) Oven | 20 minutes | 190° F. (88° C.) |

Comparative Resistance After Steps (f) (single pass), (g) (microetch), and (m) (double pass) of Run 3

| | Resistance | |
|---|---|---|
| Panel | After Single Pass | After Double Pass |
| (1) Multilayer | 5.5KΩ | 3.2KΩ |
| (2) Multilayer | 6.4KΩ | 3.9KΩ |
| (3) Double-sided | 6.9KΩ | 1.1KΩ |
| (4) Double-sided | 4.5KΩ | 1.7KΩ |

3. The Graphite Dispersion of the Present Invention

In each of Runs 4–7, panels of identical size and configuration, as used above, were subject to the same preparative steps (Steps (a)–(d)) described above. However, instead of them being immersed in a carbon black dispersion, the four panels of each of Runs 4–7 were immersed in the graphite dispersion of Example 8.

The process of Runs 4–7 comprised the following steps:

| | | |
|---|---|---|
| a) Cleaner/Conditioner (2.5%) | 5 minutes | 140° F. (60° C.) |
| b) Rinse | 1 minute | Room Temp. |
| c) Conditioner (2.5%) | 5 minutes | Room Temp. |
| d) Rinse | 1 minutes | Room Temp. |
| e) Graphite Dispersion | 5 minutes | Room Temp. |
| f) Oven Dry | 20 minutes | 190° F. (88° C.) |

Resistance Measured After Single Pass

| | Panel | Resistance |
|---|---|---|
| RUN 4 | (1) Multilayer | 60 ohms |
| | (2) Multilayer | 80 ohms |
| | (3) Double-sided | 27 ohms |
| | (4) Double-sided | 42 ohms |
| RUN 5 | (1) Multilayer | 52 ohms |
| | (2) Multilayer | 73 ohms |
| | (3) Double-sided | 53 ohms |
| | (4) Double-sided | 93 ohms |
| RUN 6 | (1) Double-sided | 60 ohms |
| | (2) Double-sided | 172 ohms |
| | (3) Double-sided | 71 ohms |
| | (4) Double-sided | 126 ohms |
| RUN 7 | (1) Multilayer | 89 ohms |
| | (2) Double-sided | 95 ohms |
| | (3) Multilayer | 89 ohms |
| | (4) Double-sided | 23 ohms |

Double Pass (Graphite)

To test the effect of a double pass through the graphite dispersion, a pair of multilayer panels were subjected to the process of Steps (a) through (f) and their respective resistances measured:

Resistance After The First Pass

| | |
|---|---|
| (1) Multilayer | 24 ohms |
| (2) Multilayer | 30 ohms |

Thereafter, multilayer panels were again immersed in the graphite dispersion (Step (e)) and then dried (Step (f)) and their respective resistances were again measured:

Resistance After The Second Pass

| | |
|---|---|
| (1) Multilayer | 8 ohms |
| (2) Multilayer | 8 ohms |

In another series of runs, a second pair of multilayer panels were subjected to two passes through the process of Steps (a) through (f) and their resistance were measured after Step (f) of each pass:

| Resistance After First Pass | |
| --- | --- |
| (3) Multilayer | 32 ohms |
| (4) Multilayer | 34 ohms |
| Resistance After Second Pass | |
| (3) Multilayer | 13 ohms |
| (4) Multilayer | 11 ohms |

The data in this Example establishes that the graphite compositions of the present invention, when used in the process of the present invention, produced through hole deposits of graphite that had substantially higher conductivities (lower resistivities) than the through hole deposits of carbon black produced by the composition and methods of the '741 patent. Examination of cross-sections of these through holes also revealed that the graphite composition provided no pullaway and improved adhesion compared to carbon black compositions.

EXAMPLE 8

For use in Examples 9–11 herein, the following cleaner/conditioner, graphite composition, and fixer solutions were prepared.

Working Cleaner/Conditioner

A working cleaner/conditioner solution was prepared by diluting one volume of the cleaner/conditioner concentrate sold commercially as SHADOW cleaner/conditioner 1 by Electrochemicals, Inc., Youngstown, Ohio with nine volumes of DI water. In practice, the working cleaner/conditioner was maintained within the range of 140°–160° F. (60°–71° C.).

Graphite Composition:

Using the method of Example 4, the following components were mixed together and the pH adjusted to 10.5:

| | |
| --- | --- |
| 263 g | graphite |
| 5829 ml | DI water |
| 36 g | potassium carbonate |
| 28 g | sodium carboxymethylcellulose |
| 6 g | potassium bicarbonate |
| 1.2 g | ACRYSOL I-1955 |
| 4.8 g | ACRYSOL I-545 |
| 7.4 g | FLUORAD FC-120 |
| 1.85 g | TAMOL 819 |

Fixer Bath:

Sixteen ml. of concentrated sulfuric acid were added to a sufficient volume of DI water to avoid splattering and then diluted to 4 liters. In practice, the diluted sulfuric acid solution is placed in a fixer bath and heated between 120° F.–140° F. (49°–60° C.). The graphite composition of the present invention was fixed by immersing the graphite coated circuit board or dielectric in the bath for a time between thirty seconds and one minute.

EXAMPLE 9

A desmeared 3 inch (76 mm.) square four layer circuit board (Sample 1) and a 2 inch (51 mm.) square four layer circuit board (Sample 2) were treated with the working cleaner and conditioner of Example 8, rinsed with DI water for about 15–20 seconds, and then treated with the graphite composition of Example 8. The resistivity of the dried boards was as follows:

| | |
| --- | --- |
| Sample 1: | 10 ohms |
| Sample 1 (after etching) | 38.1 ohms |
| Sample 2 | 19 ohms |

EXAMPLE 10

Effect of Dilution on the Composition and Method of the Present Invention

A composition with the following ingredients is prepared according to the method of Example 4:

| Parts By Weight | Component |
| --- | --- |
| 263 | graphite |
| 1029 | water |
| 36 | potassium carbonate |
| 28 | sodium carboxymethylcellulose |
| 6 | potassium bicarbonate |
| 1.2 | ACRYSOL I-1955 |
| 4.8 | ACRYSOL I-545 |
| 7.4 | FLUORAD FC-120 |

In this Example, three concentrations of the graphite composition are tested on both 2"×2" double-sided ("DS") and multi-layer ("ML") coupons. The concentrations tested are "as is," at a two-to-one (2:1) dilution by volume and at an eight-to-one (8:1) dilution by volume.

LINE MAKEUP FOR GRAPHITE PROCESS

1) Working Cleaner/Conditioner from Example 8, 5 minutes, at 149° F. (65° C.).

2) Rinse—DI water, 15–20 seconds.

3) Graphite composition ("as is," 2:1 or, 8:1), 5 minutes, at 75° F. (24° C.).

4) Fixer as per Example 8, when used below.

5) Dry a) blow dry 1–2 minutes.

b) oven dry 15 minutes, at 180° F. (82° C.).

| | RESULTS | |
| --- | --- | --- |
| Coupon | Measured Resistivity (ohms) | Typical results (predicted and observed) |
| "As is" ML, with fixer | 1.1 | Small holes clogged, surface lumps; poor result |
| "As is" DS, with fixer | 1.2 | Small holes clogged, surface lumps; poor result |
| 2:1 ML, with fixer | 6.5 | 100% surface coverage; excellent result |
| 8:1 ML, with fixer | 336 | 90% surface coverage; good result |
| 8:1 DS, with fixer | 49 | 90% surface coverage; good result |
| "As is" ML, no fixer | 1.1 | Small and large holes clogged, no surface lumps; poor result |
| "As is" DS, no | 0.8 | Small and large holes |

-continued

| Coupon | Measured Resistivity (ohms) | Typical results (predicted and observed) |
|---|---|---|
| fixer | | clogged, no surface lumps; poor result |
| 8.1 ML, no fixer | 7.1 | 100% surface coverage; but non-uniform coating; poor result |
| 8.1 Ds, no fixer | 7.5 | 100% surface coverage, but non-uniform coating; poor result |

The date for Examples 10 and 11 shows that the "as-is" composition used here is apparently too concentrated and forms an undesirably thick coating, with or without a fixer. The 2:1 dilution with a fixer provides excellent results—the resistance is low, and 100% surface coverage is obtained (typically providing an excellent, uniform coating of desirable thickness). The 8:1 dilution was found (under the conditions of this test) to provide undesirably low surface coverage (90%) and high resistivity if a fixer was used. The 8:1 dilution without a fixer would typically provide an undesirably non-uniform coating.

EXAMPLE 11

Effect of Dilution of The Graphite Composition and Etch on Resistivity

| Coupon | Pre Etch Resistivity (From Example 10) | Post Etch Resistivity |
|---|---|---|
| "As is" ML, fixer | 1.1 ohms | 508 ohms |
| "As is" ML, no fixer | 1.1 ohms | 223 ohms |
| 2:1 ML, fixer | 6.5 ohms | 156 ohms |
| 8:1 ML, fixer | 336 ohms | >4,600 ohms |
| 8:1 ML, no fixer | 7.1 ohms | 417 ohms |

EXAMPLE 12

Effect of Dilution on Coverage as Determined by Back Light Testing

The composition of Example 10 was further diluted and tested as in Example 10 for surface coverage. No fixer was used in this experiment. The resulting data is shown in the table below.

| Coupon | % Coverage |
|---|---|
| 8:1 ML, no fixer | 90–95% |
| 14:1 ML, no fixer | 60–70% |
| 30:1 ML, no fixer | 40–60% |
| 70:1 ML, no fixer | 0–20% |
| 150:1 ML, no fixer | 0.5% |

This data shows that coverage is reduced as the graphite composition is diluted. A 30:1 or less dilution was shown to be usable, while a 150:1 dilution was shown to be unusable for a single pass process, in this instance. It is contemplated that all the tested dilutions could be made to provide acceptable results by using a multiple pass process.

EXAMPLE 13

Effect of pH of the Graphite Dispersion's Ability to Act as a Conductive Surface for Electroplating A stock bath of the graphite dispersion of the present invention was prepared as described herein and its pH was found to be 10.47. This sample was run as the control. Two aliquots of the dispersion had their pH's adjusted to 5.18 and 13.3 respectively. Three identical panels, namely panel #1 (pH 10.47), panel #2 (pH 5.18), and panel #3 (pH 13.3), were subjected to the following process which differed for each panel only in the indicated pH of the dispersion.

| | |
|---|---|
| 1) Cleaner/Conditioner | 162° F. (72° C.), 5 minutes |
| 2) Water rinse | Room Temp.(RT), 2 minutes |
| 3) Graphite Dispersion Bath | RT, 5 minutes |
| 4) Fixer | 120° F. (49° C.), 45 seconds |
| 5) Dry | Blow Dry |
| 6) Etch | 30 micro inches (0.76 microns) of copper removed |
| 7) Preplate | Clean Circlean S, 120° F. (49° C.), 30 seconds |
| 8) Rinse | 30 seconds |
| 9) Etch sodium persulfate | 1 min. 15–20 micro inches (0.38 to 0.5 microns) removed |
| 10) Rinse | 1 minute |
| 11) Electroplate | 5 minutes, 15 amp/3 panels |

All three panels initiated at an equal time (1 minute). After five minutes, the coverage was the same on all panels and no voids, blisters or lumps were observed under an 8× eye loupe.

The resistivities of the three panels were measured at various stages during the process of Example 13. The three panels based upon the pH of the graphite dispersion, are identified as #1 (control, pH 10.47), panel #2 (pH 5.18), and panel #3 (pH 13.3 ):

| Resistivity Before Etch (Step 6) | |
|---|---|
| 1. | 21 ohms |
| 2. | 36 ohms |
| 3. | 35.6 ohms |
| Resistivity After Etch (Step 6) | |
| 1. | 76 ohms |
| 2. | 66 ohms |
| 3. | 110 ohms |
| Resistivity After Chem Clean (Step 7) | |
| 1. | 218 ohms |
| 2. | 113 ohms |
| 3. | 182 ohms |

EXAMPLES 14–23

Additional Formulations of Graphite Dispersion

The graphite dispersions having the ingredients set forth in the Example 14–23. Tables are prepared. In the tables, all weights are weights of solids, and carbon composition weights are weights of dry carbon. Each dispersion is prepared and used in the same manner as the previously described formulations for making the walls of through holes conductive. In each case, the walls are made more conductive, thereby enabling the walls to be electroplated.

EXAMPLE 24

Preparation of Carbon Black Dispersion

Colloidal carbon black having an average particle diameter of about 1 micron was combined with deionized water and an organic dispersing agent, forming a dispersion having a viscosity of about 800 cps, a pH of 9.6, and a solids content of 25%. 100 ml of the colloidal graphite dispersion and 400 ml. of DI water were stirred to make a working bath.

EXAMPLE 25

Preparation of Carbon Black Dispersion

To 500 ml. of the dispersion of Example 24 were added 3 g potassium carbonate, 1 g potassium bicarbonate, 0.1 g. ACRYSOL I-1955 binding agent, 0.4 g. of ACRYSOL 1–545 binding agent, and 0.2 g. of FLUORAD FC-120 surfactant.

EXAMPLE 26

Preparation of Carbon Black Dispersion

To 500 ml. of the dispersion of Example 24 were added 3 g potassium carbonate, 1 g potassium bicarbonate, 0.2 g. ACRYSOL I-1955 binding agent, 0.8 g. of ACRYSOL I-545 binding agent, and 0.2 g. of FLUORAD FC-120 surfactant.

EXAMPLE 27

Preparation of Carbon Black Dispersion

Colloidal carbon black having an average particle diameter of about 1 micron was combined with deionized water and an organic dispersing agent, forming 100 ml. of a dispersion having a viscosity of about 800 cps, a pH of 9.6, and a solids content of 25%. Separately, 2 g of sodium carboxymethylcellulose and 400 ml. of DI water were mixed using high speed mixing. The carbon black and carboxymethylcellulose dispersions were mixed to make a working bath.

EXAMPLE 28

Preparation of Carbon Black Dispersion

To 500 ml. of the dispersion of Example 27 were added 3 g. of potassium carbonate and 1 g. of potassium bicarbonate, resulting in a pH of 10.9.

EXAMPLE 29

Preparation of Carbon Black Dispersion

To 500 ml of the dispersion of Example 28 were added 0.2 g ACRYSOL I-1955 and 0.8 g. ACRYSOL I-545 binding agents.

EXAMPLE 30

Preparation of Carbon Black Dispersion

To 500 ml of the dispersion of Example 28 were added 0.4 g. ACRYSOL 8-1955 and 1.6 g. of ACRYSOL I-545 binding agents.

EXAMPLE 31

Preparation of Carbon Black Dispersion 1.5% by volume COLUMBIAN RAVEN 350 carbon black, 1.0% by volume MAPHOS 56 surfactant, and 0.6% by volume potassium hydroxide were added in that order to enough DI water to make up 1 liter, with high speed mixing. The pH of the composition was 13.7.

EXAMPLE 32

Preparation of Carbon Black Dispersion

To one liter of the dispersion of Example 31 were added 2.5 g. of sodium carboxymethylcellulose.

EXAMPLE 33

Preparation of Carbon Black Dispersion

To one liter of the dispersion of Example 32 were added 0.1 g. ACRYSOL I-1955 binding agent and 0.4 g. of ACRYSOL 1-545 binding agent.

EXAMPLE 34

Preparation of Carbon Black Dispersion

To one liter of the dispersion of Example 31 were added 0.4 g. ACRYSOL I-1955 binding agent and 0.4 g. of ACRYSOL I-545 binding agent.

EXAMPLE 35

Preparation of Carbon Black Dispersion

A commercially available BLACKHOLE carbon black dispersion is diluted with DI water to 2.5% solids.

EXAMPLE 36

Preparation of Carbon Black Dispersions

To 500 ml of a commercially available BLACKHOLE carbon black dispersion are added 0.1 g. ACRYSOL I-1995 binding agent, 0.4 g. of ACRYSOL I-545 binding agent, and enough DI water to dilute the dispersion to 2.5% solids, forming a first dispersion.

Second, third, and fourth dispersions are made, each having the same active ingredients as the first, but respectively prepared with less water to provide 5% solids, 7.5% solids, and 10% solids.

Additional dispersions are made like the first four, but additionally containing 1.25 g of sodium carboxymethylcellulose per 500 ml. of BLACKHOLE dispersion.

Additional dispersions are made by combining 1.25 g. of sodium carboxy methylcellulose with 500 ml. of BLACKHOLE dispersion and diluting the same to 2.5%, 5%, 7.5%, and 10% solids in separate trials.

These BLACKHOLE dispersions with additives provide conductive through hole coatings with improved adhesion and/or lower resistivity than BLACKHOLE dispersions as sold commercially.

EXAMPLE 37

Preparation of $H_2SO_4$ Fixer

A solution of 4 ml concentrated sulfuric acid per liter of DI water was prepared.

EXAMPLE 38

Preparation of Cleaner/Conditioner 10 g of monoethanolamine, 15 g. of NEODOL 91-8 surfactant, 2 g. of SANDOLEC CF cationic polyamidoamine, and 1 g. of ethylene glycol were mixed with enough DI water to make up one liter. This formulation is a combination of the cleaning and conditioning ingredients disclosed in U.S. Pat. No. 5,139,642, col. 6, ln. 52–63 and col. 16, ln. 14–28.

EXAMPLE 39

Preparation of Conditioner 10 g of monoethanolamine and 5 g. of SANDOLEC CF cationic polyamidoamine were mixed with enough DI water to make up one liter. This formulation is a combination of the ingredients of the conditioner disclosed at col. 16, ln. 23–28 of U.S. Pat. No. 5,139,642.

EXAMPLE 40

First Line Makeup For Carbon Black Process

The carbon black compositions of Examples 24, 25, and 27–30 were used in a dip process in the following order, under the indicated conditions, to improve the conductivity of through holes on double-sided coupons.

1) SHADOW cleaner/conditioner 1, available from Electrochemicals, Inc., Youngstown, Ohio, 5 minutes, at 140° F. (60° C).
2) Rinse—water, 1 minute at room temperature.
3) Carbon black composition, 5 minutes, at room temperature.
4) Drip time, 1 minute at room temperature.
5) Fixer (if any), 45 seconds at 135° F. (57° C.).
6) Dry (ominates at 190° F. (88° C.).
7) sodium persulfate microetch (10% in water, 80° F., 27° C.), 30 seconds.
8) Rinse, 20 seconds at room temperature.
9) Dry.

EXAMPLE 41

Second Line Makeup for Carbon Black Process

The compositions of Examples 31, 32, and 34 were used in a dip process in the following order, under the indicated conditions, to improve the conductivity of through holes on double-sided coupons.

1) Working Cleaner/Conditioner from Example 38, 5 minutes, at 130° F. (54° C.).
2) Rinse—DI water, 2 minutes at room temperature.
3) Conditioner from Example 39, 4 minutes, at room temperature.
4) Rinse—same as step 2.
5) Carbon black composition, 4 minutes at room temperature.
6) Fixer (if used).
6) Dry.
7) sodium persulfate microetch, (10% in water, 80° F., 27° C.) 30 seconds.
8) Rinse, 20 seconds at room temperature.

EXAMPLE 42

Third Line Makeup for Carbon Black Process
(Double Pass)

The compositions of Examples 31, 32, 33, and 34 were used in a dip process in the following order, under the indicated conditions, to improve the conductivity of through holes on double-sided coupons.

1) Working Cleaner/Conditioner from Example 38, 5 minutes, at 130° F. (54° C.).
2) Rinse, water, 2 minutes at room temperature.
3) Conditioner from Example 39, 4 minutes, at room temperature.
4) Rinse—same as step 2.
5) Carbon black composition, 4 minutes at room temperature.
6) Dry.
7) Carbon black composition, 4 minutes at room temperature.
8) Dry.

EXAMPLE 43

First Line Make-up for Electroplating

In Examples 45–60, coupons were electroplated conventionally by sequentially dipping them in the baths and under the conditions described below.

1) Acid cleaner.
2) Rinse.
3) Microetch, sodium persulfate.
4) Rinse.
5) 10% concentrated sulfuric acid (aqueous).
6) copper bath (45 minutes, 30 amperes per square foot, 2.8 amperes per square meter current, plating to 1 mil (25 micron) thickness.
7) Rinse, DI water.
8) Dry in air.
9) Expose to Thermal shock.
10) cross-section for testing.

The necessary chemicals and more details about plating conditions and test methods suitable for plating copper on a circuit board are commercially available from Electrochemicals, Inc., Youngstown, Ohio.

EXAMPLES 44–59

Through Hole Coating and Electroplating Processes

The carbon black compositions, process chemicals, and protocols of Examples 24–43 were used to coat 2 inch (51 mm.×2 inch (51 mm.) double-sided ("DS") coupons including 20 mil (0.mm) diameter, 0.6 inch (15 mm.) through holes, using a dip process. The resistivities of the coatings were measured before and after microetching. Where indicated, the coupons were then conventionally electroplated as printed wiring boards would be processed, the through holes were sectioned by cutting the boards, and the plated through holes were evaluated for lumpiness, pullaway, and voids under microscopic examination.

The compositions, details of the coating process, resistivities, and plating results are summarized in the table for Examples 44–59 below. Several results are indicated by this experimental work.

First, the carbon black dispersion modified with MAPHOS 56 surfactant and potassium hydroxide, used in Examples 50–56 and prepared in Examples 31–33, provided high resistivity (exceeding 1 kilohm) to the treated through holes, even before microetching. Without additional ingredients (as tested in Examples 50, 51, and 56), the use of the carbon black/MAPHOS 56/KOH formulation of Example 31 resulted in pullaway, lumpiness, or voids. With additives according to the present invention, as in Example 55 (using the formulation of Example 33), this carbon black/MAPHOS 56/KOH formulation can provide very good plating results, however.

Second, compositions which do not contain sodium carboxymethylcellulose can provide good performance, too. The carbon black/carbonates/ACRYSOL/FLUORAD system of Example 45 gave the best results in these tests.

Third, if an $H_2SO_4$ fixer was used, the carbon black dispersion of Example 24 alone gave very good results and low resistivity (Example 44). Nonetheless, the carbon black dispersion performance (in particular, adhesion, resistivity, or both) can be further improved by adding the carbonate, ACRYSOL, and FLUORAD ingredients (Example 47) or sodium carboxymethylcellulose (Examples 46–47).

EXAMPLE 60

Carbon Black/Graphite Mixtures

The graphite experiments of Examples 4–23 are repeated, substituting an equal weight of the carbon black of Example 24 for 10% by weight of the graphite of the respective examples 4–23. The results demonstrate the utility of each composition for coating through holes to lower their resistivity, enabling them to be electroplated.

EXAMPLE 61

Carbon Black/Graphite Mixtures

The carbon black experiments of Examples 24–59 are repeated, substituting an equal weight of the graphite of Example 8 for 90% by weight of the carbon black of the respective examples 24–59. The results demonstrate the utility of each composition for coating through holes to lower their resistivity, enabling them to be electroplated. The electroplated through holes pass a solder shock test.

| Ingredient | Example (By Weight) | | | |
| --- | --- | --- | --- | --- |
| | 14 | 15 | 16 | 17 |
| SHOWA DENKO ULTRAFINE | 5.00 | 5.50 | — | — |
| ASBURY MICRO 440 | — | — | 5.45 | — |
| AQUADAGE E | — | — | — | 4.50 |
| Na Carboxymethylcellulose | 0.20 | 0.39 | 0.25 | — |
| $K_2CO_3$ | 1.007 | 1.00 | — | — |
| $KHCO_3$ | 0.57 | 0.50 | — | — |
| TRITON X-100 | — | — | — | 0.38 |
| MAPHOS 56 | 0.40 | 0.25 | — | — |
| fumed silica | — | — | — | 0.57 |
| 2-ethylhexanol | — | — | — | 0.03 |
| ANTIFOAM A | trace | — | — | — |
| Deionized water | 92.90 | 92.31 | 93.80 | 94.52 |

| Ingredient | Example (By Weight) | | |
| --- | --- | --- | --- |
| | 18 | 19 | 20 |
| AQUADAGE E | 2.00 | — | — |
| GRAPHITE 850 | — | 3.00 | — |
| GRAFO 1204B | — | — | 4.40 |
| GRAPHOKOTE 90 | — | — | 1.25 |
| ACRYSOL I-545 | — | — | 0.03 |
| ACRYSOL I-1955 | — | 0.50 | 0.01 |
| Na Carboxymethylcellulose | — | 0.20 | 0.39 |
| $K_2CO_3$ | 1.00 | 1.00 | 1.00 |
| $KHCO_3$ | 0.50 | 1.00 | 1.00 |
| FLUORAD FC-120 | — | 0.40 | 0.25 |
| 2-ethylhexanol | 0.03 | — | — |
| ANTIFOAM A | trace | — | — |
| Deionized water | 96.47 | 93.90 | 91.67 |

| Ingredient | Example (By Weight) | | |
| --- | --- | --- | --- |
| | 21 | 22 | 23 |
| GRAFO 1204B | 4.25 | — | — |
| GRAPHOKOTE 90 | — | 2.00 | — |
| GRAPHITE 450 | — | — | 2.75 |
| ACRYSOL I-545 | 0.08 | — | .04 |
| ACRYSOL I-1955 | 0.01 | — | — |
| TAMOL 819 | 0.03 | — | — |
| Na Carboxymethylcellulose | 0.5 | — | — |
| $K_2CO_3$ | 0.6 | — | — |
| $KHCO_3$ | 0.1 | — | — |
| TRITON X-100 | — | 0.38 | 0.38 |
| MAPHOS 56 | 0.25 | — | — |
| FLUORAD FC-120 | 0.1 | — | — |
| fumed silica | — | 0.57 | 0.01 |
| Al Silicate | — | — | 0.56 |
| 2-ethylhexanol | — | 0.03 | .02 |
| Deionized water | 94.07 | 97.02 | 96.24 |

| Ex. | Additions to Carbon Black Dispersion | Details of Coating Process | Resistivity Before/After Microetch (Ohms) | Qualitative Plating Results |
| --- | --- | --- | --- | --- |
| 44 | None (Ex. 24) | Dip; Single Pass (Ex. 40); $H_2SO_4$ Fixer (Ex. 37) | 18 ohms before 68 ohms after | Very Good |
| 45 | $K_2CO_3$ $KHCO_3$ ACRYSOL FLUORAD (Ex. 25) | Dip; Single Pass (Ex. 40); $H_2SO_4$ Fixer | 30 ohms before 43 ohms after | Very Good (better adhesion than Ex. 44) |

| Ex. | Additions to Carbon Black Dispersion | Details of Coating Process | Resistivity Before/After Microetch (Ohms) | Qualitative Plating Results |
|---|---|---|---|---|
| 46 | CMC (Ex. 27) | Dip; Single Pass (Ex. 40); H₂SO₄ Fixer (Ex. 37) | 16 ohms before 52 ohms after | Slight Pullaway |
| 47 | CMC K₂CO₃ KHCO₃ (Ex. 28) | Dip; Single Pass (Ex. 40); H₂SO₄ Fixer (Ex. 37) | 23 ohms before 60 ohms after | Good; No Pullaway |
| 48 | CMC K₂CO₃ KHCO₃ ACRYSOL (Ex. 29) | Dip; Single Pass (Ex. 40); H₂SO₄ Fixer (Ex. 37) | 19 ohms before 72 ohms after | Good; No Pullaway |

| Ex. | Additions to Carbon Black Dispersion | Details of Coating Process | Resistivity Before/After Microetch (Ohms) | Qualitative Plating Results |
|---|---|---|---|---|
| 49 | CMC K₂CO₃ KHCO₃ ACRYSOL (Ex. 30) | Dip; Single Pass (Ex. 40); H₂SO₄ Fixer (Ex. 37) | 32 ohms before 93 ohms after | Good; No Pullaway |
| 50 | MAPHOS 56 KOH (Ex. 31) | Dip; Single Pass (Ex. 41); H₂SO₄ Fixer (Ex. 37) | 7000 ohms before 20,000 ohms after | Voids |
| 51 | MAPHOS 56 KOH (Ex. 31) | Dip Single Pass (Ex. 41); No Fixer | 1600 ohms before 2500 ohms after | Good Plating; Pullaway |
| 52 | MAPHOS 56 KOH CMC (Ex. 32) | Dip; Single Pass (Ex. 41); H₂SO₄ Fixer (Ex. 37) | 1800 ohms before 2500 ohms after | Good Plating; Pullaway |
| 53 | MAPHOS 56 KOH CMC (Ex. 32) | Dip Single Pass (Ex. 41); No Fixer | 2200 ohms before 7300 ohms after | Good Plating; Slight Pullaway |
| 54 | MAPHOS 56 KOH CMC (Ex. 32) | Dip; Double Pass (Ex. 42); No Fixer | 1200 ohms before 3000 ohms after | Slight Pullaway |
| 55 | MAPHOS 56 KOH CMC ACRYSOL (Ex. 33) | Dip; Double Pass (Ex. 42); No Fixer | 3000 ohms before 4300 ohms after | Very Good Plating; No Pullaway |
| 56 | MAPHOS 56 KOH (Ex. 31) | Dip; Double Pass (Ex. 42); No Fixer | 1800 ohms before 5400 ohms after | Good Plating; Pullaway; Lumpiness |
| 57 | ACRYSOL (Ex. 34) | Dip: Single Pass (Ex. 41); H₂SO₄ Fixer (Ex. 37) | 2600 ohms before 500,000 ohms after | Voids; Pullaway |
| 58 | ACRYSOL (Ex. 34) | Dip; Single Pass (Ex. 41); No Fixer | 5000 ohms before 90,000 ohms after | Pullaway; Voids |
| 59 | ACRYSOL (Ex. 34) | Dip; Double Pass (Ex. 42); No Fixer | 1700 ohms before 300,000 ohms after | Good Plating; Slight Pullaway; No Voids |

What is claimed is:

1. A method for electroplating a conductive metal layer onto a substrate including a conductive metallic surface and at least one non-conductive through hole surface, said method comprising, the steps of:

A. providing a liquid dispersion of carbon comprising from about 0.1 to about 20% by weight electrically conductive carbon having a mean particle size within the range from about 0.05 to about 50 microns; from about 0.01 to about 10% by weight of a water dispersible binding agent for binding to said carbon particles; and an aqueous dispersing medium;

B. applying said liquid dispersion to the conductive metallic surface and to the non-conductive through hole surrface, forming a coating thereon;

C. separating substantially all of the aqueous dispersing medium from the carbon of said coating, whereby said carbon is deposited on the non-conductive through hole surface in a substantially continuous layer, and said carbon is also deposited on the conductive metallic surface;

D. after said separating step, microetching the conductive metallic surface and the non-conductive through hole surface, thereby removing substantially all of said carbon from the conductive metallic surface while leaving a substantially continuous layer of said carbon on the non-conductive through hole surface; and E. electroplating a substantially continuous metal layer over said carbon deposited on said non-conductive through hole surface.

2. The method of claim 1 wherein said carbon is a synthetic graphite.

3. The method of claim 1, wherein said carbon has a mean particle size that is within the range of about 0.3 to 1.0 microns.

4. The method of claim 1, wherein said carbon has a mean particle size within the range of about 0.7 to about 1.0 microns.

5. The method of claim 1, wherein said dispersion of carbon further comprises an anionic dispersing agent having a molecular weight less than 1000.

6. The method of claim 1, wherein said pH is within the range of from about 9 to about 11.

7. The method of claim 6, wherein said dispersion of carbon further comprises amounts of carbonate and bicarbonate ions effective to maintain said pH within said range of from about 9 to about 11.

8. The method of claim 1, wherein said dispersion of carbon further comprises at least one surfactant in an amount effective to wet the through hole of a printed circuit board contacted with said composition.

9. The method of claim 8, wherein said surfactant comprises an anionic fluorochemical surfactant.

10. The method of claim 5, wherein said dispersing agent is an acrylic latex.

11. The method of claim 1, wherein said applying step is carried out by a one-pass process.

12. The method of claim 1, further including, between said applying and separating steps, the step of applying a fixing solution to the dispersion coating.

13. The method of claim 12, wherein said fixing solution is an aqueous solution containing 0.1–5% by volume of a mineral acid.

14. The method of claim 13, wherein said mineral acid is sulfuric acid.

15. A method for electroplating a conductive metal layer to the non-conductive surface of a through hole, comprising the steps of:

A. providing a liquid dispersion of carbon comprising from about 0.1 to about 20% by weight electrically conductive carbon having a mean particle size within the range from about 0.05 to about 50 microns in an aqueous dispersing medium;

B. applying said liquid dispersion to the non-conductive surfaces of said through hole, whereby said carbon particles are deposited on said non-conductive surfaces of said through hole in a substantially continuous layer to form a dispersion coating thereon;

C. after said applying step, without an intervening drying step, contacting said dispersion coating with an aqueous acid solution having a pH from about 0.01 to about 6;

D. after said contacting step, drying said dispersion coating; and

E. electroplating a substantially continuous metal layer over said dispersion coating.

16. The method of claim 15, wherein said acid is sulfuric acid.

17. The method of claim 15, wherein said pH is from about 0.1 to about 4.

18. The invention of claim 1, wherein said liquid dispersion of carbon has a pH between about 4 and about 14.

19. The invention of claim 15, wherein said liquid dispersion of carbon has a pH between about 4 and about 14.

* * * * *